(12) United States Patent
Stefanoski et al.

(10) Patent No.: US 11,737,244 B2
(45) Date of Patent: Aug. 22, 2023

(54) EMBEDDED AND IMMERSED HEAT PIPES IN AUTOMATED DRIVING SYSTEM COMPUTERS

(71) Applicant: GM Cruise Holdings LLC, San Francisco, CA (US)

(72) Inventors: Zoran Stefanoski, San Francisco, CA (US); Yung Chang Ko, San Francisco, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 13 days.

(21) Appl. No.: 17/701,875

(22) Filed: Mar. 23, 2022

(65) Prior Publication Data

US 2022/0217871 A1    Jul. 7, 2022

Related U.S. Application Data

(63) Continuation of application No. 16/730,490, filed on Dec. 30, 2019, now Pat. No. 11,324,143.

(51) Int. Cl.
| | |
|---|---|
| *H05K 7/20* | (2006.01) |
| *H01L 23/427* | (2006.01) |
| *H01L 23/473* | (2006.01) |
| *F28F 3/04* | (2006.01) |
| *G05D 1/02* | (2020.01) |

(52) U.S. Cl.
CPC ........... *H05K 7/20509* (2013.01); *F28F 3/04* (2013.01); *G05D 1/021* (2013.01); *H01L 23/427* (2013.01); *H01L 23/473* (2013.01); *H05K 7/20254* (2013.01); *H05K 7/20336* (2013.01); *H05K 7/20872* (2013.01); *H05K 7/20881* (2013.01)

(58) Field of Classification Search
CPC ........... H05K 7/20254; H05K 7/20336; H05K 7/20509; F28F 3/04; G05D 1/021
See application file for complete search history.

(56) References Cited

U.S. PATENT DOCUMENTS

| | | |
|---|---|---|
| 6,421,240 B1 | 7/2002 | Patel |
| 6,687,126 B2 | 2/2004 | Patel et al. |
| 6,808,015 B2 | 10/2004 | Osakabe |
| 6,880,626 B2 | 4/2005 | Lindemuth et al. |
| 6,997,245 B2 | 2/2006 | Lindemuth et al. |

(Continued)

FOREIGN PATENT DOCUMENTS

| | | | |
|---|---|---|---|
| CN | 107864595 A | * 3/2018 | ......... H05K 7/20336 |
| KR | 20150088694 A | 8/2015 | |

*Primary Examiner* — Robert J Hoffberg
(74) *Attorney, Agent, or Firm* — Novak Druce Carroll LLP

(57) ABSTRACT

Technologies for embedded and immersed heat pipes in automated driving system computers (ADSC) are described herein. In some examples, an ADSC can include one or more cold plates including one or more fluid channels, the one or more fluid channels being configured to circulate a first working fluid from a respective ingress point to a respective egress point; one or more processors coupled to the one or more cold plates; one or more heat pipes coupled to or embedded in the one or more cold plates and configured to collect heat from the one or more processors and transfer the heat away from the one or more processors via a second working fluid in the one or more heat pipes; and a chassis housing the one or more cold plates, the one or more processors, and the one or more heat pipes.

20 Claims, 17 Drawing Sheets

(56) References Cited

U.S. PATENT DOCUMENTS

| | | | |
|---|---|---|---|
| 7,013,958 B2 | 3/2006 | Garner et al. | |
| 7,077,189 B1 * | 7/2006 | Reyzin | H01L 23/473 165/83 |
| 7,551,442 B2 | 6/2009 | Stefanoski | |
| 7,796,389 B2 | 9/2010 | Edmunds et al. | |
| 7,924,565 B2 * | 4/2011 | Huang | H05K 7/20336 174/547 |
| 8,059,405 B2 * | 11/2011 | Campbell | F28F 3/02 361/679.53 |
| 8,081,463 B2 * | 12/2011 | Chiu-Mao | H05K 7/20218 174/15.1 |
| 8,194,406 B2 * | 6/2012 | Campbell | H05K 7/20827 361/698 |
| 8,274,787 B2 | 9/2012 | Alyaser et al. | |
| 8,422,231 B2 * | 4/2013 | Huang | H05K 7/20218 361/709 |
| 8,755,179 B2 | 6/2014 | Alyaser et al. | |
| 8,873,237 B2 | 10/2014 | Stefanoski | |
| 9,019,704 B2 | 4/2015 | Rubenstein et al. | |
| 9,292,058 B2 | 3/2016 | Demange | |
| 10,481,652 B2 | 11/2019 | Rice et al. | |
| 10,779,446 B2 | 9/2020 | Bourlier et al. | |
| 10,959,352 B1 * | 3/2021 | Chen | H05K 7/20772 |
| 11,324,143 B2 * | 5/2022 | Stefanoski | H05K 7/20509 |
| 11,324,144 B2 * | 5/2022 | Stefanoski | G05D 1/021 |
| 2005/0174735 A1 | 8/2005 | Mankaruse et al. | |
| 2006/0162903 A1 * | 7/2006 | Bhatti | F28F 3/12 165/104.21 |
| 2006/0254752 A1 * | 11/2006 | Narakino | H01L 23/473 165/125 |
| 2007/0204646 A1 | 9/2007 | Gagliano | |
| 2021/0204445 A1 | 7/2021 | Stefanoski et al. | |
| 2021/0320048 A1 | 10/2021 | Limaye et al. | |
| 2021/0321526 A1 | 10/2021 | Kulkarni et al. | |

\* cited by examiner

EMBEDDED AND IMMERSED HEAT PIPES IN AUTOMATED DRIVING SYSTEM COMPUTERS

CROSS-REFERENCE TO RELATED APPLICATIONS

This application is a continuation of U.S. application Ser. No. 16/730,490, filed on Dec. 30, 2019, entitled, EMBEDDED AND IMMERSED HEAT PIPES IN AUTOMATED DRIVING SYSTEM COMPUTERS, which is hereby expressly incorporated by reference in its entirety and for all purposes.

TECHNICAL FIELD

The present disclosure generally relates to thermal management for automated driving system computers.

BACKGROUND

An autonomous vehicle is a motorized vehicle that can navigate without a human driver. An exemplary autonomous vehicle can include various sensors, such as a camera sensor, a light detection and ranging (LIDAR) sensor, and a radio detection and ranging (RADAR) sensor, amongst others. The sensors collect data and measurements that the autonomous vehicle can use for operations such as navigation. The sensors can provide the data and measurements to an automated driving system computer (ADSC) of the autonomous vehicle, which can use the data and measurements to control a mechanical system of the autonomous vehicle, such as a vehicle propulsion system, a braking system, or a steering system. Typically, the ADSC is a high performance computing system with a wide array of electronic and compute components and systems that work together to perform a number of complex operations for the autonomous vehicle and control various systems on the autonomous vehicle.

While high performance computing systems are available in consumer and enterprise applications, such computing systems are not equipped to handle the harsh and often unpredictable operating conditions of vehicles. For example, autonomous vehicles and internal components of autonomous vehicles, such as ADSCs, can experience a variety of harsh and often hazardous environmental and operating conditions such as extreme temperatures (e.g., extreme hot and/or cold temperatures), extreme temperature fluctuations, weather elements (e.g., wind, rain, snow, ice, humidity, etc.), potentially harmful environmental particles or matter (e.g., dust, dirt, grease, etc.), damaging forces (e.g., shock, vibrations, impacts, collisions, etc.), water, rough terrains, and other harsh or hazardous environmental and operating conditions.

In the autonomous vehicle context, thermal management of electronic and compute components and systems in ADSCs is particularly challenging as electronic and compute components are vulnerable to, and generally ill-suited to handle, the harsh and extreme weather and temperature conditions experienced by autonomous vehicles. Indeed, the electronic and compute components available can succumb to the harsh and extreme weather and temperature conditions experienced in the operational domain of autonomous vehicles. What is needed in the art is thermal management technologies that enable ADSCs and internal ADSC components to manage and withstand the difficult conditions experienced in the operational domain of autonomous vehicles.

BRIEF DESCRIPTION OF THE DRAWINGS

The various advantages and features of the present technology will become apparent by reference to specific implementations illustrated in the appended drawings. A person of ordinary skill in the art will understand that these drawings only show some examples of the present technology and would not limit the scope of the present technology to these examples. Furthermore, the skilled artisan will appreciate the principles of the present technology as described and explained with additional specificity and detail through the use of the accompanying drawings in which.

DETAILED DESCRIPTION

Figure 1:
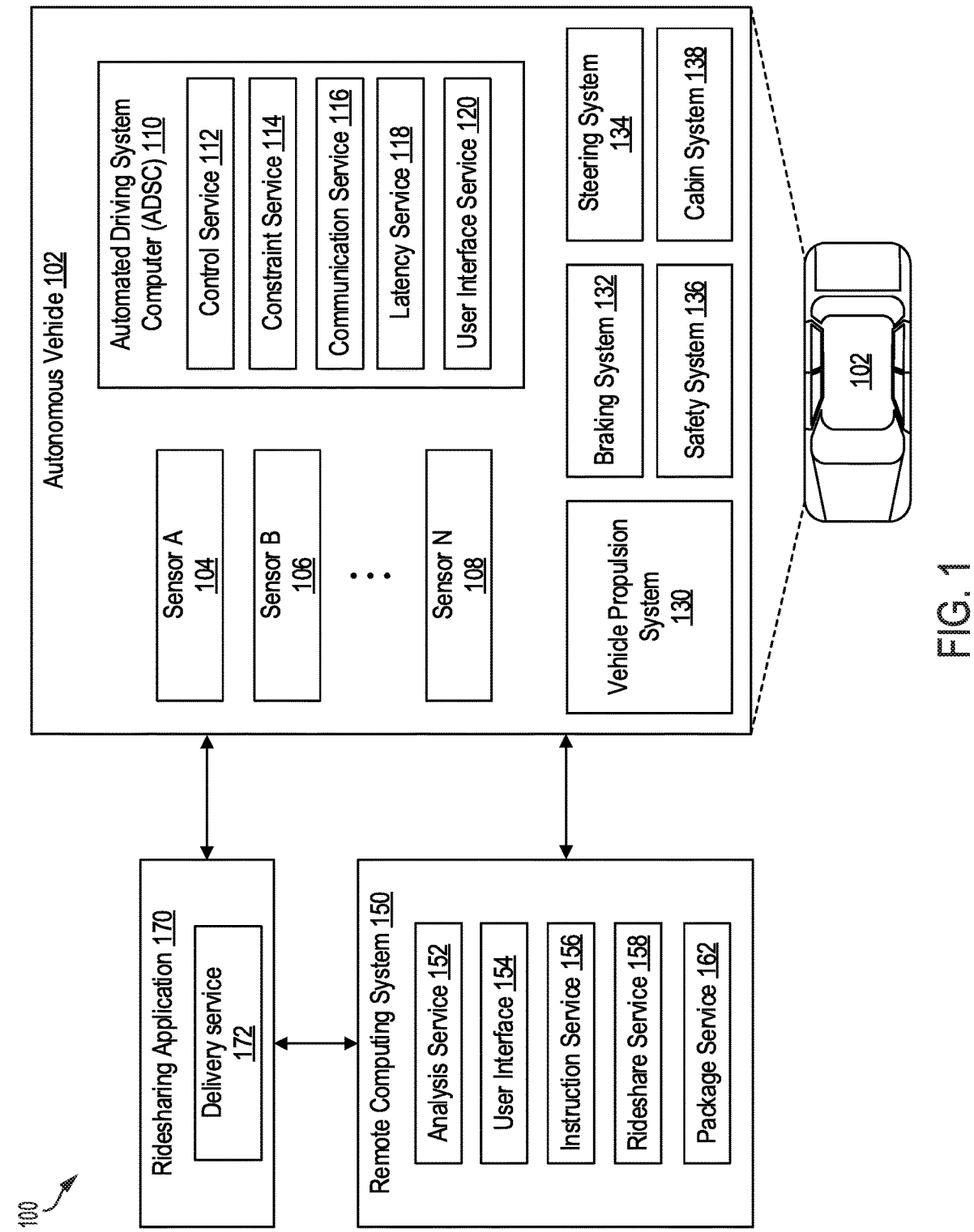
FIG. 1 illustrates an example autonomous vehicle environment including a computing system in communication with an autonomous vehicle.

Various examples of the present technology are discussed in detail below. While specific implementations are discussed, it should be understood that this is done for illustration purposes only. A person skilled in the relevant art will recognize that other components and configurations may be used without parting from the spirit and scope of the present technology. In some instances, well-known structures and devices are shown in block diagram form in order to facilitate describing one or more aspects. Further, it is to be understood that functionality that is described as being carried out by certain system components may be performed by more or fewer components than shown.

The disclosed technologies address a need in the art for improved thermal management strategies for automated driving system computers (ADSCs) and ADSC compute and electronic components. As previously explained, autonomous vehicles and ADSCs can experience a variety of harsh and often hazardous environmental and operating conditions such as extreme temperatures, extreme temperature fluctuations, weather elements (e.g., wind, rain, snow, ice, humidity, etc.), harmful environmental particles or matter (e.g., dust, dirt, grease, etc.), damaging forces (e.g., shock, vibrations, impacts, collisions, etc.), water, rough terrains, and other harsh or hazardous environmental and operating conditions. As a result, thermal management of electronic and compute components in ADSCs can be very challenging as electronic and compute components are vulnerable to, and generally ill-suited to handle, the harsh and extreme weather and temperature conditions experienced by autonomous vehicles.

The approaches herein can provide thermal management strategies and technologies that can enable ADSCs and internal ADSC components (e.g., internal electronic and compute components) to handle and withstand the difficult conditions experienced in the operational domain of autonomous vehicles. In some examples, the approaches herein can implement enhanced cold plates in ADSCs designed to provide enhanced thermal management benefits to internal components in the ADSCs and can allow the internal components to handle and withstand harsh and extreme weather, temperature, and other environmental conditions experienced by ADSCs in autonomous vehicles.

In the following disclosure, systems and methods are provided for thermal management in ADSCs and associated compute and electronic components. The present technologies will be described in the following disclosure as follows. The discussion begins with a description of example autonomous vehicle environments and systems, technologies and techniques for thermal management of ADSCs and ADSC internal components, as illustrated in FIGS. 1 through 12. A description of example flows and methods for thermal management of ADSCs and ADSC internal components, as illustrated in FIGS. 13A through 15, will then follow. The discussion concludes with a description of an example computing device architecture, including example hardware components that can be implemented in ADSCs, as illustrated in FIG. 16. The disclosure now turns to FIG. 1.

FIG. 1 illustrates an example autonomous vehicle environment 100. The example autonomous vehicle environment 100 includes an autonomous vehicle 102, a remote computing system 150, and a ridesharing application 170. The autonomous vehicle 102, remote computing system 150, and ridesharing application 170 can communicate with each other over one or more networks, such as a public network (e.g., a public cloud, the Internet, etc.), a private network (e.g., a local area network, a private cloud, a virtual private network, etc.), and/or a hybrid network (e.g., a multi-cloud or hybrid cloud network, etc.).

The autonomous vehicle 102 can navigate about roadways without a human driver based on sensor signals generated by sensors 104-108 on the autonomous vehicle 102. The sensors 104-108 on the autonomous vehicle 102 can include one or more types of sensors and can be arranged about the autonomous vehicle 102. For example, the sensors 104-108 can include, without limitation, one or more inertial measuring units (IMUs), one or more image sensors (e.g., visible light image sensors, infrared image sensors, video camera sensors, surround view camera sensors, etc.), one or more light emitting sensors, one or more global positioning system (GPS) devices, one or more radars, one or more light detection and ranging sensors (LIDARs), one or more sonars, one or more accelerometers, one or more gyroscopes, one or more magnetometers, one or more altimeters, one or more tilt sensors, one or more motion detection sensors, one or more light sensors, one or more audio sensors, etc. In some implementations, sensor 104 can be a radar, sensor 106 can be a first image sensor (e.g., a visible light camera), and sensor 108 can be a second image sensor (e.g., a thermal camera). Other implementations can include any other number and type of sensors.

The autonomous vehicle 102 can include several mechanical systems that are used to effectuate motion of the autonomous vehicle 102. For instance, the mechanical systems can include, but are not limited to, a vehicle propulsion system 130, a braking system 132, and a steering system 134. The vehicle propulsion system 130 can include an electric motor, an internal combustion engine, or both. The braking system 132 can include an engine brake, brake pads, actuators, and/or any other suitable componentry configured to assist in decelerating the autonomous vehicle 102. The steering system 134 includes suitable componentry configured to control the direction of movement of the autonomous vehicle 102 during navigation.

The autonomous vehicle 102 can include a safety system 136. The safety system 136 can include lights and signal indicators, a parking brake, airbags, etc. The autonomous vehicle 102 can also include a cabin system 138, which can include cabin temperature control systems, in-cabin entertainment systems, etc.

The autonomous vehicle 102 can include an automated driving system computer (ADSC) 110 in communication with the sensors 104-108 and the systems 130, 132, 134, 136, and 138. The ADSC 110 can include one or more internal computers and/or computing systems. Moreover, the ADSC 110 can include one or more compute components or processors such as, for example, one or more central processing units (CPUs), one or more graphics processing units (GPUs), one or more digital signal processors (DSPs), one or more image signal processors (ISPs), one or more Intellectual Property (IP) cores, one or more microprocessors, etc. The ADSC 110 can also include one or more hardware components and/or electronic circuits such as, for example, one or more field-programmable gate arrays (FPGAs), one or more application-specific integrated circuits (ASICs), one or more storage devices, one or more memory devices, one or more communications devices (e.g., network interface card (NIC), wireless NIC, antenna, etc.), one or more sensors (e.g., image or camera sensor, radar sensor, LIDAR sensor, etc.), one or more GPS devices, etc.

In some examples, the ADSC 110 includes one or more processors and at least one memory for storing instructions executable by the one or more processors. The computer-executable instructions can make up one or more services for controlling the autonomous vehicle 102, communicating with remote computing system 150, receiving inputs from passengers or human co-pilots, logging metrics regarding data collected by sensors 104-108 and human co-pilots, etc.

In some cases, the ADSC 110 can include a control service 112 configured to control operation of the vehicle propulsion system 130, the braking system 132, the steering system 134, the safety system 136, and the cabin system 138. The control service 112 can receive sensor signals from the sensors 104-108 can communicate with other services of the ADSC 110 to effectuate operation of the autonomous vehicle 102. In some examples, control service 112 may carry out operations in concert with one or more other systems of autonomous vehicle 102.

In some cases, the ADSC 110 can also include a constraint service 114 to facilitate safe propulsion of the autonomous vehicle 102. The constraint service 114 includes instructions for activating a constraint based on a rule-based restriction upon operation of the autonomous vehicle 102. For example, the constraint may be a restriction on navigation that is activated in accordance with protocols configured to avoid occupying the same space as other objects, abide by traffic laws, circumvent avoidance areas, etc. In some examples, the constraint service 114 can be part of the control service 112.

The ADSC 110 can also include a communication service 116. The communication service 116 can include software and/or hardware elements for transmitting and receiving signals to and from the remote computing system 150. The communication service 116 can be configured to transmit information wirelessly over a network, for example, through an antenna array or interface that provides cellular (long-term evolution (LTE), $3^{rd}$ Generation (3G), $5^{th}$ Generation (5G), etc.) communication.

In some examples, one or more services of the ADSC 110 are configured to send and receive communications to remote computing system 150 for reporting data for training and evaluating machine learning algorithms, requesting assistance from remote computing system 150 or a human operator via remote computing system 150, software service updates, ridesharing data, etc.

The ADSC 110 can also include a latency service 118. The latency service 118 can utilize timestamps on communications to and from the remote computing system 150 to determine if a communication has been received from the remote computing system 150 in time to be useful. For example, when a service of the ADSC 110 requests feedback from remote computing system 150 on a time-sensitive process, the latency service 118 can determine if a response was timely received from remote computing system 150, as information can quickly become too stale to be actionable. When the latency service 118 determines that a response has not been received within a threshold period of time, the latency service 118 can enable other systems of autonomous vehicle 102 or a passenger to make decisions or provide needed feedback.

The ADSC 110 can also include a user interface service 120 that can communicate with cabin system 138 to provide information or receive information to a human co-pilot or passenger. In some examples, a human co-pilot or passenger can be asked or requested to evaluate and override a constraint from constraint service 114. In other examples, the human co-pilot or passenger may wish to provide an instruction to the autonomous vehicle 102 regarding destinations, requested routes, or other requested operations.

As described above, the remote computing system 150 can be configured to send and receive signals to and from the autonomous vehicle 102. The signals can include, for example and without limitation, data reported for training and evaluating services such as machine learning services, data for requesting assistance from remote computing system 150 or a human operator, software service updates, rideshare data, commands or instructions, statistics, navigation data, vehicle data, etc.

The remote computing system 150 can include an analysis service 152 configured to receive data from autonomous vehicle 102 and analyze the data to train or evaluate machine learning algorithms for operating the autonomous vehicle 102. The analysis service 152 can also perform analysis pertaining to data associated with one or more errors or constraints reported by autonomous vehicle 102.

The remote computing system 150 can also include a user interface service 154 configured to present metrics, video, images, sounds reported from the autonomous vehicle 102 to an operator of remote computing system 150, maps, routes, navigation data, notifications, user data, vehicle data, software data, and/or any other content. User interface service 154 can receive, from an operator, input instructions for the autonomous vehicle 102.

The remote computing system 150 can also include an instruction service 156 for sending instructions regarding the operation of the autonomous vehicle 102. For example, in response to an output of the analysis service 152 or user interface service 154, instructions service 156 can prepare instructions to one or more services of the autonomous vehicle 102 or a co-pilot or passenger of the autonomous vehicle 102.

The remote computing system 150 can also include a rideshare service 158 configured to interact with ridesharing applications 170 operating on computing devices, such as tablet computers, laptop computers, smartphones, head-mounted displays (HMDs), gaming systems, servers, smart devices, smart wearables, and/or any other computing devices. In some cases, such computing devices can be passenger computing devices. The rideshare service 158 can receive from passenger ridesharing app 170 requests, such as user requests to be picked up or dropped off, and can dispatch autonomous vehicle 102 for a requested trip.

The rideshare service 158 can also act as an intermediary between the ridesharing app 170 and the autonomous vehicle 102. For example, rideshare service 158 can receive from a passenger instructions for the autonomous vehicle 102, such as instructions to go around an obstacle, change routes, honk the horn, etc. The rideshare service 158 can provide such instructions to the autonomous vehicle 102 as requested.

The remote computing system 150 can also include a package service 162 configured to interact with the ride-sharing application 170 and/or a delivery service 172 of the ridesharing application 170. A user operating ridesharing application 170 can interact with the delivery service 172 to specify information regarding a package to be delivered using the autonomous vehicle 102. The specified information can include, for example and without limitation, package dimensions, a package weight, a destination address, delivery instructions (e.g., a delivery time, a delivery note, a delivery constraint, etc.), and so forth.

The package service 162 can interact with the delivery service 172 to provide a package identifier to the user for package labeling and tracking. Package delivery service 172 can also inform a user of where to bring their labeled package for drop off. In some examples, a user can request the autonomous vehicle 102 come to a specific location, such as the user's location, to pick up the package. While delivery service 172 has been shown as part of the ridesharing application 170, it will be appreciated by those of ordinary skill in the art that delivery service 172 can be its own separate application.

One beneficial aspect of utilizing autonomous vehicle 102 for both ridesharing and package delivery is increased utilization of the autonomous vehicle 102. Instruction service 156 can continuously keep the autonomous vehicle 102 engaged in a productive itinerary between rideshare trips by filling what otherwise would have been idle time with productive package delivery trips.

Figure 2:
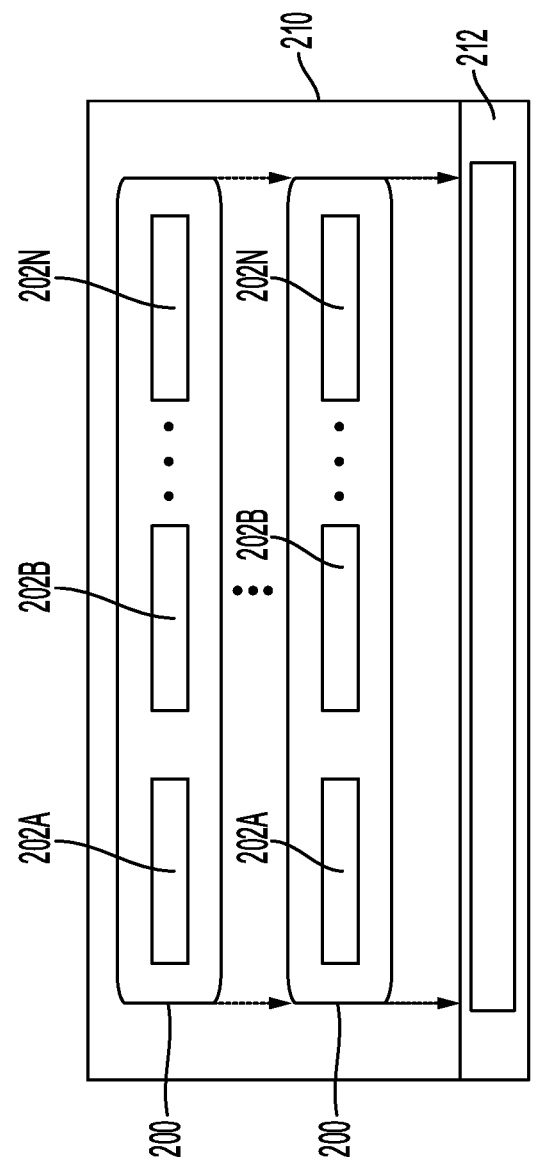
FIG. 2 is a schematic diagram illustrating an example configuration of an autonomous driving system computer that can be implemented in an autonomous vehicle, in accordance with some examples.

FIG. 2 is a schematic diagram illustrating an example configuration of ADSC 110. In this example, the ADSC 110 includes a chassis 210 for housing, stabilizing and protecting internal components of the ADSC 110. In some cases, the chassis 210 can be a rugged enclosure designed for durability and the capacity to withstand extended use in harsh and/or unpredictable environments. For example, autonomous vehicles and the internal components of autonomous vehicles can experience a variety of environmental conditions such as, for example, extreme temperatures (e.g., extreme cold and hot temperatures), temperature fluctuations, wind, water and humidity, dust, dirt, grease, snow, ice, vibrations, shock, impacts, collisions, rough terrains, and other environmental hazards and conditions. Thus, the chassis 210 can be designed to stabilize the internal components of the ADSC 110 and protect them from such harsh conditions and environments.

The chassis 210 can house and stabilize computing components 202A-N (collectively "202"), one or more enhanced cold plates 200 used to provide thermal management for the computing components 202, and one or more power electronics components 212, such as a power supply, for supplying power to the computing components 202.

In some examples, some or all of the computing components 202 can be directly or indirectly mounted or coupled to the one or more enhanced cold plates 200. In other examples, some or all of the computing components 202 can be mounted on, or coupled to, one or more structures and/or boards, such as printed circuit boards (PCBs), which can be directly or indirectly coupled to the one or more enhanced cold plates 200.

The computing components 202 can include, for example and without limitation, one or more storage devices, one or more CPUs, one or more GPUs, one or more DSPs, one or more ISPs, one or more FPGAs, one or more ASICs, one or more controllers, one or more power electronics, one or more sensors, one or more memory devices (e.g., RAM, ROM, cache, and/or the like), one or more networking interfaces (e.g., wired and/or wireless communications interfaces and the like), and/or other electronic circuits or hardware, processing devices, computer software, firmware, or any combination thereof. As further described herein, the one or more enhanced cold plates 200 can include, for example and without limitation, one or more heat pipes, one or more vapor chambers, one or more fans, one or more fluid channels or tubes, one or more air channels, one or more heat sinks, one or more heat spreaders, one or more heat exchangers, one or more pumps, one or more reservoirs, one or more condensers, and/or one or more thermal management components or features.

In some examples, the one or more enhanced cold plates 200 can include a single enhanced cold plate. In other examples, the one or more enhanced cold plates 200 can include multiple enhanced cold plates. For example, in some cases, the chassis 210 can house a series, stack, cluster, or set of layers of enhanced cold plates used to provide thermal management for the computing components 202. Moreover, the size and number of enhanced cold plates 200 implemented for the ADSC 110 can vary based on one or more factors such as, for example, thermal management requirements, number and/or type of electronic components (e.g., computing components 202, etc.) in the ADSC 110, power requirements associated with the ADSC 110, size and/or shape of the ADSC 110, type and/or characteristics of the autonomous vehicle 102 where the ADSC 110 is deployed, performance requirements associated with the ADSC 110, space considerations, environmental factors, and/or any other factors that can impact the power, thermal, space, performance, and/or configuration requirements associated with the ADSC 110.

In some examples, the chassis 210 can also house one or more other components such as, for example and without limitation, one or more fans, one or more heat sinks, one or more heat spreaders, one or more heat exchangers, one or more pumps, one or more reservoirs, one or more condensers, one or more thermal management components or features, one or more cables or wires, one or more interfaces, one or more control systems, other electronic circuits, other electronic hardware, tubing/pipes, etc. An illustrative example of computing device and hardware components that can be implemented by the ADSC 110 and housed by the chassis 210 are described below with respect to FIG. 16.

While the ADSC 110 is shown to include certain components, one of ordinary skill will appreciate that the ADSC 110 can include more or fewer components than those shown in FIG. 2. The components and arrangement of components shown in FIG. 2 are provided as illustrative examples for clarity and explanation purposes.

Figure 3:
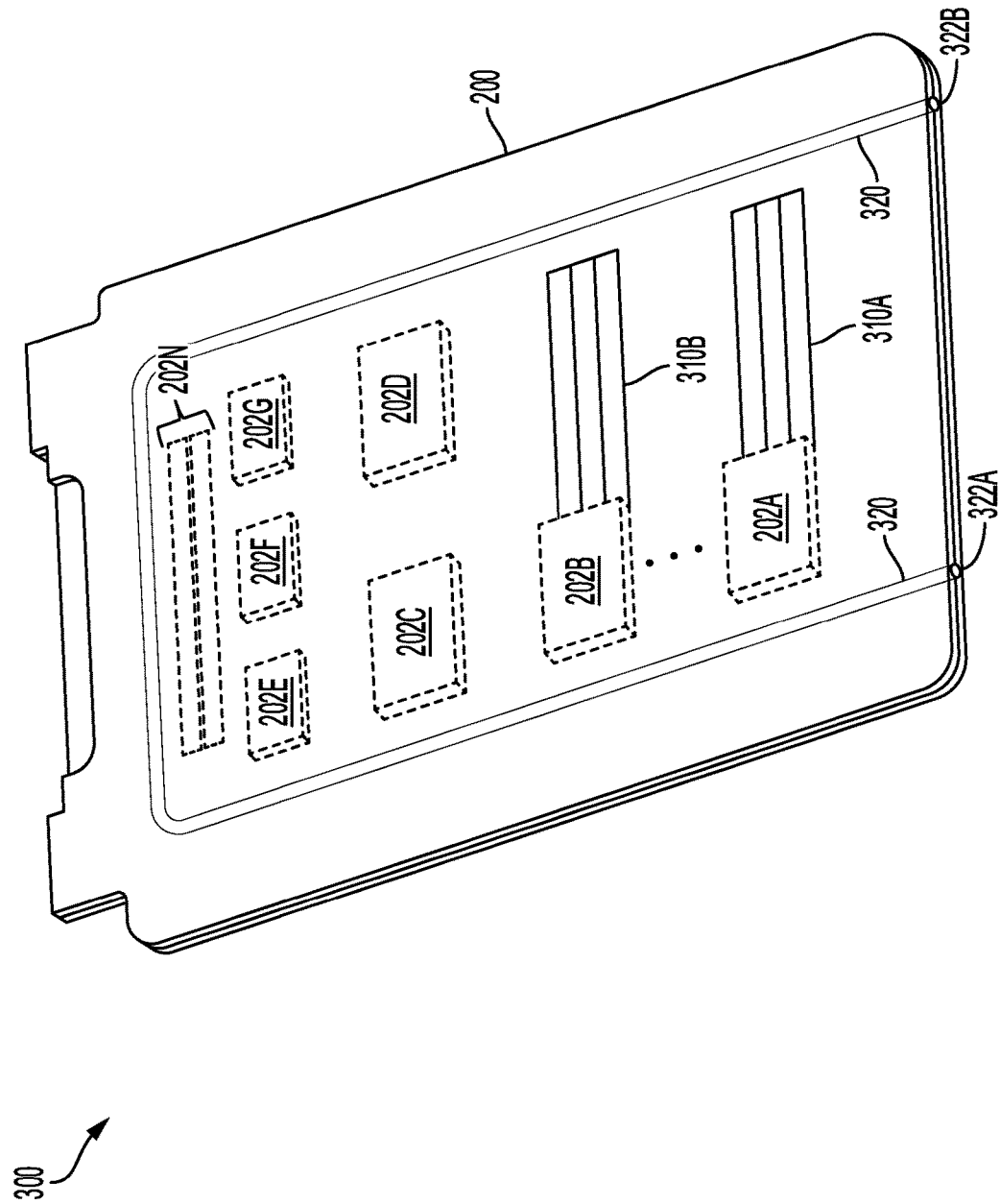
FIGS. 3 through 7 are schematic diagrams illustrating example configurations of an enhanced cold plate that uses heat pipes for thermal management and can be implemented in an autonomous driving system computer, in accordance with some examples.

FIG. 3 is a schematic diagram illustrating an example configuration 300 of an enhanced cold plate 200 that can be implemented in the ADSC 110. The enhanced cold plate 200 can provide various thermal management features and benefits for the computing components 202A-N of the ADSC 110. As previously explained, in some cases, the computing components 202A-N can be directly or indirectly mounted or coupled to the enhanced cold plate 200 and, in other cases, the computing components 202A-N can be mounted or coupled to one or more structures and/or boards, such as PCBs, which can be directly or indirectly coupled to the enhanced cold plate 200.

In the example configuration 300 shown in FIG. 3, the enhanced cold plate 200 includes heat pipes 310A-B (collectively "310") and a fluid channel 320 for removing, transferring and/or dissipating heat away from the computing components 202A-N. The heat pipes 310 can be at least partly embedded in or coupled to the enhanced cold plate 200. In some examples, the heat pipes 310A and/or the heat pipes 310B can include a single heat pipe. In other examples, the heat pipes 310A and/or the heat pipes 310B can include multiple heat pipes. Moreover, the heat pipes 310A and the heat pipes 310B can include a same or different number, size, shape, and/or configuration of heat pipes. In some cases, the enhanced cold plate 200 can include more or less heat pipes 310 than shown in FIG. 3.

The heat pipes 310 are heat-transfer or dissipation components that implement thermal conductivity and phase transition to transfer heat from one location to another. Each of the heat pipes 310 can have liquid inside for transferring heat from a hot interface or area of the heat pipe to a different interface or area (e.g., a colder interface or area) of the heat pipe. The hot interface or area of the heat pipe can absorb or collect heat from one or more of the computing components 202A-N, and the different interface or area of the heat pipe can be further away from the one or more of the computing components 202A-N than the hot interface or area of the heat pipe. Thus, by transferring the heat from the hot interface or area of the heat pipe to the different interface or area, the heat pipe can transfer heat away from such computing components, thereby providing cooling and thermal management benefits to the computing components.

For example, the liquid in each heat pipe can evaporate into a gas as it absorbs heat from a heat source, such as heat from one or more of the computing components 202A-N. The gas can travel along the heat pipe to the colder interface or area of the heat pipe, moving the heat away from the heat source and the hot interface or area of the heat pipe. The gas can then condense back into a liquid and release the latent heat. The liquid then returns to the hot interface or area through capillary action, centrifugal force, or gravity, at which point the cycle can repeat.

The type of liquid in the heat pipes 310 can vary based on one or more factors and/or considerations. As previously mentioned, in the context of autonomous vehicles (e.g., 102), the environmental conditions and the conditions surrounding the ADSC 110 can vary and are often harsh or extreme. Thus, the properties of the liquid implemented with the heat pipes 310 can affect the performance of the liquid in the heat pipes 310. For example, depending on various factors environmental, implementation, and surround factors and conditions, certain liquids can lead to poor heat transfer, clogging, corrosion, and even system failure, while other liquids may have better heat transfer performance, may not clog, may limit or avoid corrosion, and may reduce the likelihood of system failure.

Accordingly, the type of liquid used in the heat pipes 310 can be selected based on the properties of the liquid and the environmental, implementation, and surround conditions in which the heat pipes 310 operate. For example, the liquid can be selected based on the properties of the liquid and the temperature in which the heat pipes 310 will operate. Non-limiting examples of factors of a liquid that can be considered when selecting a liquid can include the liquid's compatibility with the system's metals and/or the heat pipes 310, the liquid's thermal conductivity and specific heat, the liquid's viscosity, the liquid's freezing point, the liquid's flash point, the liquid's corrosivity, the liquid's toxicity, the liquid's thermal stability, etc. In some examples, the type of liquid selected can be a liquid determined to have compatibility with the system's metals and/or the heat pipes 310, high thermal conductivity and specific heat, low viscosity, a low freezing point, a high flash point, low corrosivity, low toxicity, and/or thermal stability.

In some examples, the liquid used in the heat pipes 310 can be water. In other examples, the liquid used in the heat pipes 310 can be glycol. Moreover, non-limiting examples of other liquids can include de-ionized water, dielectric fluids, alcohol (e.g., methanol, ethanol, etc.), mercury, ammonia, water/glycol, Freon, alkali metals (e.g., cesium, potassium, sodium), refrigerant R134a, etc. In some cases, the same liquid can used in all of the heat pipes 310. In other cases, different heat pipes can have different types of liquids, which can vary or can be selected based on the one or more factors previously explained.

In addition to having a working fluid, each of the heat pipes 310 can have a wick structure that can exert a capillary action on the liquid phase of the working fluid and a case (e.g., a sealed pipe or envelope) which can house the wick structure, the working fluid, and any other internal elements of the heat pipe. The case and wick structure can be designed to be compatible with the working fluid. Moreover, the materials used to construct the case and wick structure can be selected based on some or all of the environmental, implementation, and surround factors previously described. Non-limiting example materials that can be used for the case include copper, aluminum, superalloys, etc. Moreover, non-limiting examples of wick structures include a sintered powder wick, a screen mesh wick, a grooved wick, etc.

In some examples, the configuration (e.g., size, length, shape, thickness, structure, etc.) of the case and wick can also vary based on one or more factors such as, for example, the type of working fluid, the characteristics (e.g., layout, size, shape, materials, etc.) of the enhanced cold plate 200, the layout of the computing components 202A-N, the desired heat carrying capacity of the heat pipes 310, the type and/or number of computing components 202A-N, the environmental and surrounding conditions where the heat pipes 310 will operate, performance requirements or factors associated with the computing components 202A-N, and/or any other constraints that can influence the performance, stability, cost, etc., of the heat pipes 310. In some examples, the configuration of the case and wick can depend on any constrains created by the characteristics of the enhanced cold plate 200, the layout of the computing components 202A-N, and/or a desired maximum power handling or heat carrying capacity (Qmax) of the heat pipes 310.

The Qmax (e.g., the maximum capacity of power that can be handled or transferred from one point to another) can be affected by various factors such as, for example, the diameter of the heat pipes 310, the shape (e.g., flatness, roundness, curvature, amount of bending, etc.) of the heat pipes 310, the size or length of the heat pipes 310, the material of the casing of the heat pipes 310, the material of the wick in the heat pipes 310, the thickness of the wick, the porosity of the wick, the amount of working fluid, the type of working fluid, etc. In some examples, the Qmax of the heat pipes 310 can be optimized or tuned for specific operating parameters and performance characteristics by changing the internal structure of the heat pipes 310 (e.g., wick porosity, wick thickness, etc.), the physical characteristics of the heat pipes 310 (e.g., the size, shape, bending, flattening, diameter, material or composition, etc.), the composition and/or materials of the heat pipes 310, etc.

The number of heat pipes 310 implemented in the enhanced cold plate 200 can vary in different examples. The number of heat pipes 310 can be selected based on one or more factors such as, for example, the number and/or type of computing components 202A-N associated with the enhanced cold plate 200, the performance requirements of the ADSC 110 and/or the computing components 202A-N, heat and power conditions associated with the ADSC 110 and computing components 202A-N, stability considerations associated with the ADSC 110 and computing components 202A-N, the configuration (e.g., size, shape, thickness, length, structure, etc.) of the enhanced cold plate 200, environmental factors, the layout of the computing components 202A-N, the configuration of each of the heat pipes 310, the Qmax characteristics of the heat pipes 310, etc. Moreover, the layout, arrangement, position, and/or shape of the heat pipes 310 can also vary based on one or more factors, as further described herein.

As previously mentioned, in addition to including heat pipes 310, the enhanced cold plate 200 can include a fluid channel 320 for removing, transferring, dissipating, etc., heat away from the computing components 202A-N. Moreover, the fluid channel 320 can also remove, transfer, dissipate, etc., heat transferred or collected from the heat pipes 310, as further explained herein. The fluid channel 320 can include a fluid that can flow from a fluid ingress point 322A to a fluid egress point 322B. The fluid ingress point 322A and fluid egress point 322B can include ports where the fluid enters and exits the fluid channel 320, interfaces connecting the fluid channel 320 with tubes, hoses, or pipes that supply the fluid to the fluid channel 320 or points where a tube, hose or pipe of the fluid channel 320 enters and exits the enhanced cold plate 200 from and to a different location on the ADSC 110 (e.g., from and to a different enhanced cold plate, from and to a reservoir, from and to a pump, etc.), etc.

The fluid in the fluid channel 320 can be the same type of fluid as the working fluid in the heat pipes 310 or a different type of fluid. In some examples, the fluid in the fluid channel 320 can include water. In other examples, the fluid in the fluid channel 320 can include glycol. In yet other examples, the fluid channel 320 can be used as a channel for air instead of fluid. The air can be circulated through the fluid channel 320 to transfer, remove, and/or dissipate heat.

The shape, configuration, layout and placement/positioning of the fluid channel 320 and the heat pipes 310 can vary in different implementations. In the example configuration 300 shown in FIG. 3, the heat pipes 310 have a linear configuration and are coupled to computing components 202A and 202B. As shown, the heat pipes 310A are coupled to computing component 202A in order to transfer heat away from the computing component 202A, and the heat pipes 310B are coupled to computing component 202B in order to transfer heat away from the computing component 202B. The computing components 202A and 202B in this example can be any of the computing components 202 previously described. For example, the computing components 202A and 202B can be CPUs, GPUs, or any other electronic computing component.

Further, the fluid channel 320 has a u-shape and surrounds the computing components 202A-N. Thus, the fluid in the fluid channel 320 can flow from the fluid ingress point 322A, around the computing components 202A-N, until exiting at the fluid egress point 322B. As the fluid travels through the fluid channel 320, the fluid can absorb or collect heat from the computing components 202A-N and carry the heat away from the computing components 202A-N until exiting at the fluid egress point 322B. Similarly, as the fluid travels by the heat pipes 310A and 310B, the fluid can absorb heat transferred or dissipated from the heat pipes 310A and 310B, and transfer the heat away from the heat pipes 310A and 310B until exiting at the fluid egress point 322B. This cycle can repeat as fluid continues to flow or circulate around the fluid channel 320, again exiting at the fluid egress point 322B. In this way, the fluid channel 320 can enhance the cooling or thermal management features of the heat pipes 310A and 310B, and vice versa.

In some cases, the fluid channel 320 can include, implement and/or couple to one or more heat sinks. For example, one or more heat sinks can be coupled to an internal or external surface of the fluid channel 320. The one or more heat sinks can help dissipate heat collected by the fluid channel 320.

While FIG. 3 shows the fluid ingress point 322A located on an end of the enhanced cold plate 200 closer to the computing components 202A-B relative to the fluid egress point 322B, and the fluid egress point 322B located on an end of the enhanced cold plate 200 that is closer to the heat pipes 310A and 310B relative to the fluid ingress point 322A, it should be noted that this arrangement is merely an example provided for explanation purposes. In other examples, the fluid ingress point 322A and/or the fluid egress point 322B can be located elsewhere in the enhanced cold plate 200.

For example, in some cases, the fluid ingress point 322A can be located where the fluid egress point 322B is currently shown in FIG. 3, and the fluid egress point 322B can be located where the fluid ingress point 322A is currently shown in FIG. 3, such that their location is reversed and, as a result, the fluid in the fluid channel 320 flows in the opposite/reverse direction. In another example, the fluid ingress point 322A and/or the fluid egress point 322B can be located on a different side of the enhanced cold plate 200 than shown in FIG. 3 and/or different sides of the enhanced cold plate 200 relative to each other.

Figure 4:
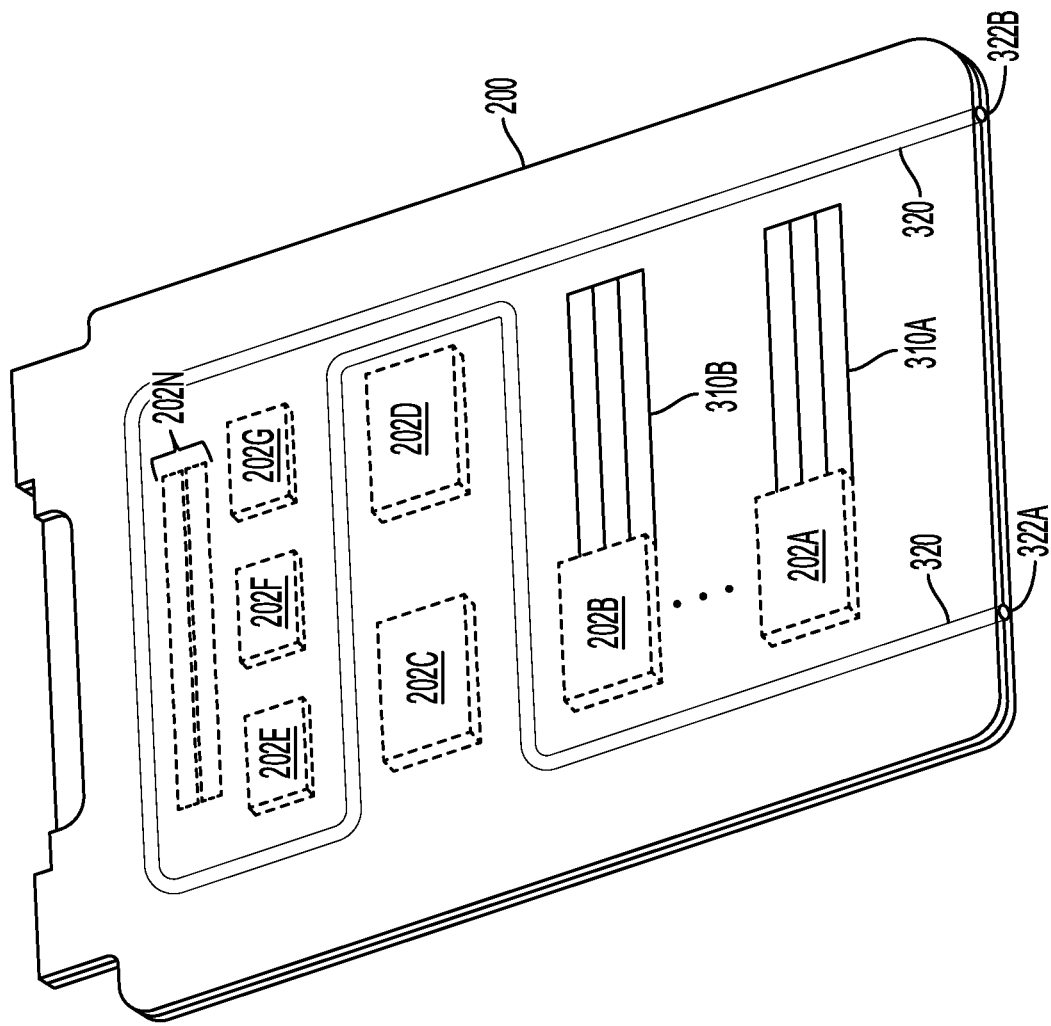

FIG. 4 is a schematic diagram illustrating another example configuration 400 of the enhanced cold plate 200. In this example, the fluid channel 320 has a different shape as the u-shape shown in FIG. 3. In particular, instead of continuing past an outer side of computing component 202C (the side opposite to computing component 202D), the fluid channel 320 turns before the computing component 202C and goes around computing components 202C and 202D in a u-shape until returning to an outer side of computing component 202E (the side opposite to computing components 202F and 202G). The fluid channel 320 then continues along the u-shape trajectory as previously shown in FIG. 3.

This layout of the fluid channel 320 can vary how heat is transferred or collected from the computing components 202C and 202D. Moreover, the layout of the fluid channel 320 can take into account specific constraints or requirements regarding fluid channel coverage, available or unobstructed space in the enhanced cold plate 200, the layout/arrangement of components/objects on the enhanced cold plate 200 (e.g., computing components 202A-N and/or any other objects or components), thermal management requirements of the ADSC 110 and/or any of the computing components 202A-N, heat transfer capabilities and/or performance of the fluid channel 320 and/or the heat pipes 310, and/or any other constraints or factors.

Figure 5:
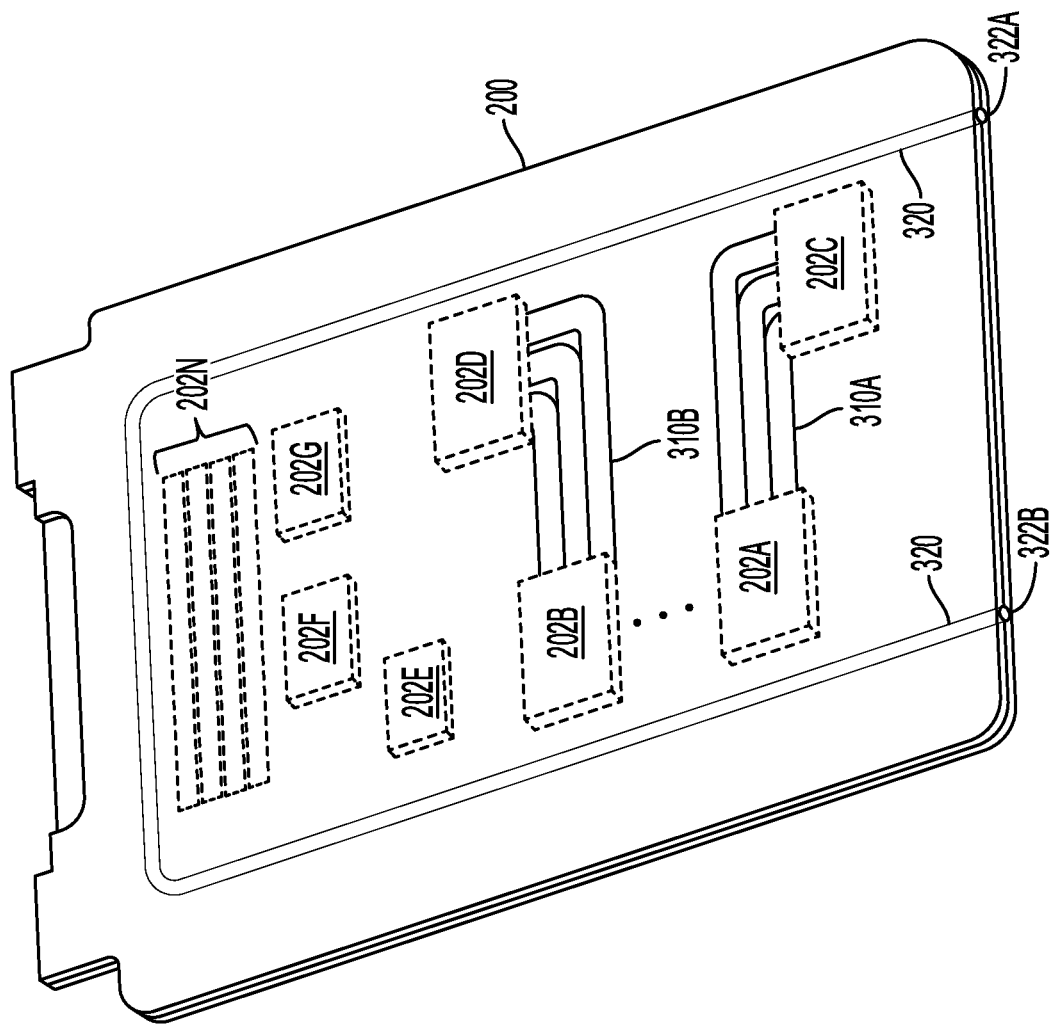

FIG. 5 is a schematic diagram illustrating another example configuration 500 of the enhanced cold plate 200. In this example, the locations of the fluid ingress point 322A and the fluid egress point 322B are reversed with respect to their locations shown in FIGS. 3 and 4. Consequently, the flow of fluid in the fluid channel 320 has similarly been reversed relative to the flow in FIGS. 3 and 4.

In addition, the arrangement of the computing components 202A-N has changed so that computing component 202C is now partly across from computing component 202A (as opposed to adjacent to computing component 202B as shown in FIGS. 3 and 4) and computing component 202D is partly across from computing component 202B. To account for the different arrangement of computing components 202C and 202D and/or provide different thermal management properties, the shape of the heat pipes 310 has also changed. Here, the heat pipes 310 are shown with a partial bend or curve.

In particular, the heat pipes 310A are now coupled at opposite ends to both computing components 202A and 202C. Given the arrangement of the computing components 202A and 202C, this coupling of the heat pipes 310A to both of the computing components 202A and 202C is enabled by the partial bend or curve of the heat pipes 310A. Moreover, this coupling of the heat pipes 310A can allow the heat pipes 310A to take heat away from both of the computing components 202A and 202C.

Similarly, the heat pipes 310B are now coupled at opposite ends to both computing components 202B and 202D. As previously explained, given the arrangement of the computing components 202B and 202D, this coupling of the heat pipes 310B to both of the computing components 202A and 202C is enabled by the partial bend or curve of the heat pipes 310B. Moreover, this coupling of the heat pipes 310B can allow the heat pipes 310B to take heat away from both of the computing components 202B and 202D.

As illustrated in FIG. 5, the shape of the heat pipes 310 can vary to account for a specific arrangement of components on the enhanced cold plate 200. The direction of the flow of fluid in the fluid channel 320 can also change as needed.

Figure 6:
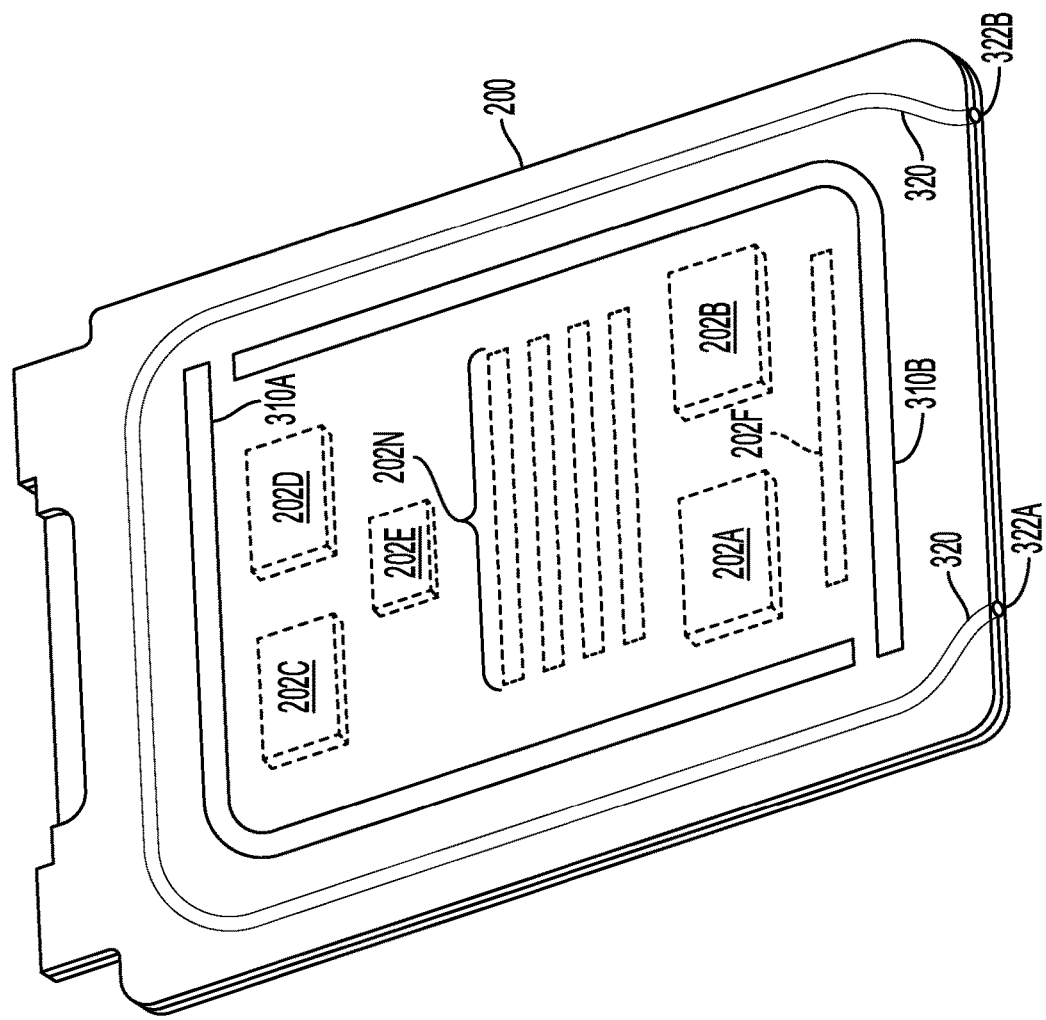

FIG. 6 is a schematic diagram illustrating another example configuration 600 of the enhanced cold plate 200. In the example configuration 600, the enhanced cold plate 200 includes a different number of heat pipes 310 and the heat pipes 310 have a different shape, size and arrangement. In particular, the enhanced cold plate 200 includes two sets of heat pipes: heat pipe 310A and heat pipe 310B. The heat pipes 310A and 310B have an L-shape and are arranged to form a rectangle or square. Moreover, the heat pipes 310A and 310B surround the computing components 202A-N such that the computing components 202A-N are contained within the rectangle or square formed by the arrangement of the heat pipes 310A and 310B. The heat pipes 310A and 310B can collect heat from the computing components 202A-N and transfer the heat away from the computing components 202A-N to provide cooling to the computing components 202A-N.

The enhanced cold plate 200 also includes a fluid channel 320 configured in a u-shape surrounding the heat pipes 310A and 310B and the computing components 202A-N. The fluid channel 320 can include fluid that circulates from the fluid ingress point 322A, around the heat pipes 310A and 310B and the computing components 202A-N, until exiting through the fluid egress point 322B. As the fluid circulates around the fluid channel 320, the fluid can collect heat from the heat pipes 310A and 310B and transfer the heat away from the heat pipes 310A and 310B (and the computing components 202A-N) to provide further cooling of the computing components 202A-N.

Figure 7:
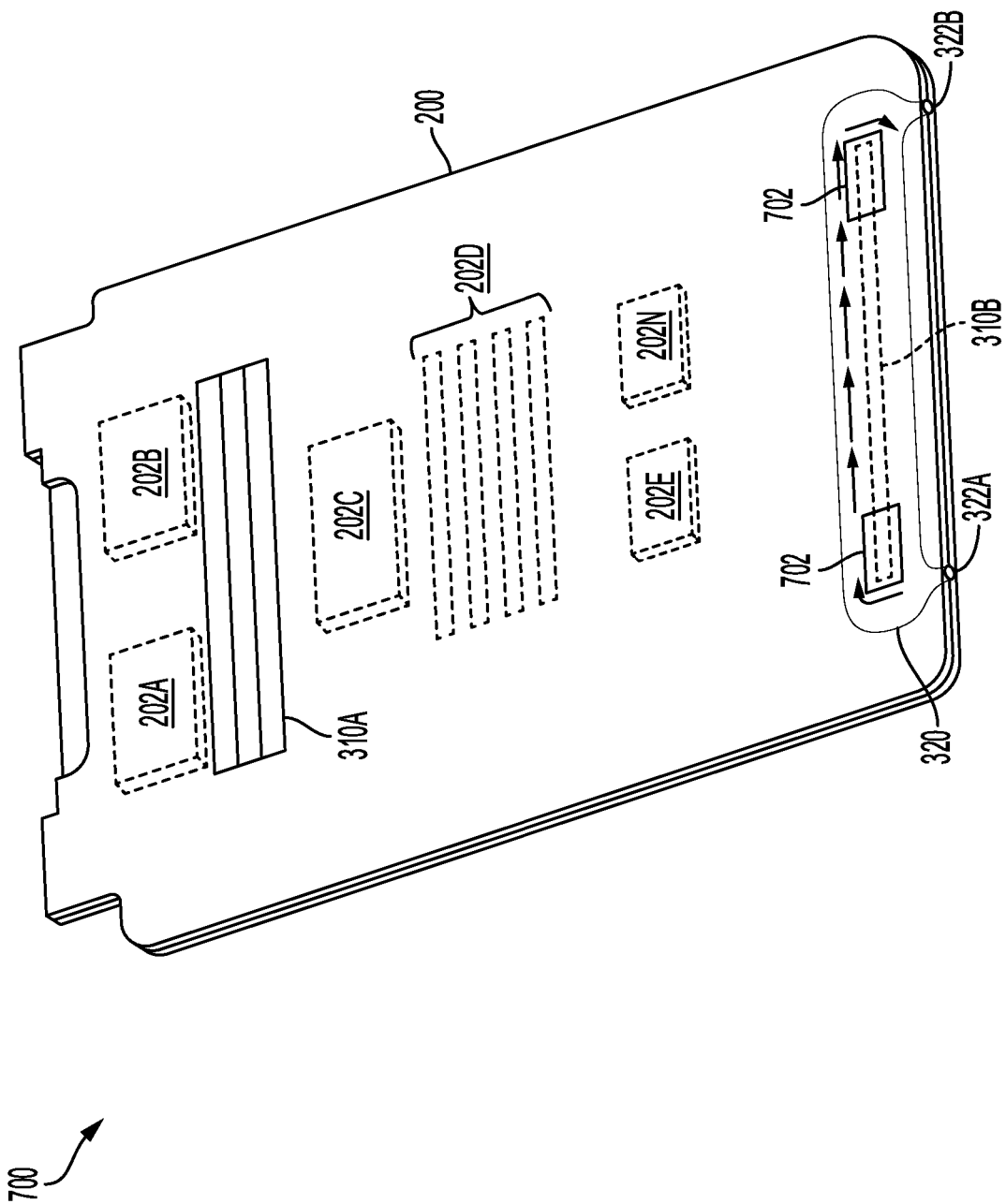

FIG. 7 is a schematic diagram illustrating another example configuration 700 of the enhanced cold plate 200. In this example, the enhanced cold plate 200 includes a set of heat pipes 310A arranged parallel or adjacent to computing components 202A and 202B. The set of heat pipes 310A can include one or more heat pipes. Moreover, the set of heat pipes 310A can dissipate heat away from the computing components 202A and 202B.

The enhanced cold plate 200 also includes a heat pipe 310B embedded, contained, or implemented within a fluid channel 320. The heat pipe 310B can help dissipate and/or transfer heat away from the computing components 202A-N. Moreover, fluid in the fluid channel 320 can collect heat from the heat pipe 310B and dissipate and/or transfer the heat away. In some examples, the fluid in the fluid channel 320 can also help dissipate and/or transfer heat away from the computing components 202A-N.

The fluid channel 320 in this example has a linear shape and is located on an end of the enhanced cold plate 200. Fluid in the fluid channel 320 can circulate from a fluid ingress point 322A and around the heat pipe 310B until exiting at a fluid egress point 322B. In some examples, the fluid in the fluid channel 320 can surround or engulf the heat pipe 310B in the fluid channel 320. In some cases, the fluid channel 320 can include heat sinks 702, which can help dissipate heat from the heat pipe 310B and/or the computing components 202A-N. In some examples, the fluid channel 320 can include a single heat sink for enhancing thermal management benefits. In other examples, the fluid channel 320 can include multiple heat sinks.

In some cases, the heat sinks 702 can be coupled to an exterior surface of the fluid channel 320 and/or the enhanced cold plate 200. In other examples, the heat sinks 702 can be enclosed within the fluid channel 320. Moreover, in some cases, the heat sinks 702 can be directly or indirectly coupled to the heat pipe 310B in the fluid channel 320. For example, the heat sinks 702 can be coupled to, and/or in contact with, different portions of the heat pipe 310B.

In some examples, the set of heat pipes 310A can dissipate heat away from the computing components 202A and 202B. The dissipated heat (as well as heat from the other computing components 202C-N) can move towards the heat pipe 310B and the fluid channel 320. The heat pipe 310B can collect the heat to transfer the heat away from the computing components 202A-N. The fluid in the fluid channel 320 and the heat sinks 702 can then further help dissipate and/or transfer the heat away from the computing components 202A-N and/or the heat pipe 310B.

While the fluid channel 320 and the heat pipe 310B in the fluid channel 320 are shown in FIG. 7 in a linear configuration/shape, it should be noted that such configuration/shape is provided herein as an example for explanation purposes. In other examples, the enhanced cold plate 200 can implement one or more fluid channels containing or housing one or more heat pipes, and the one or more fluid channels and/or the one or more heat pipes contained or housed in the one or more fluid channels can have a different size, shape, arrangement, configuration, etc.

Moreover, in some examples, the enhanced cold plate 200 shown in FIGS. 3-7 can have other cooling components or combinations of cooling components than those shown in FIGS. 3-7. For example, in some cases, the enhanced cold plate 200 can include a fan in combination with one or more heat pipes and/or one or more vapor chambers. Example configurations of the enhanced cold plate 200 that include vapor chambers are shown in FIGS. 8-12 and further described below.

Figure 8:
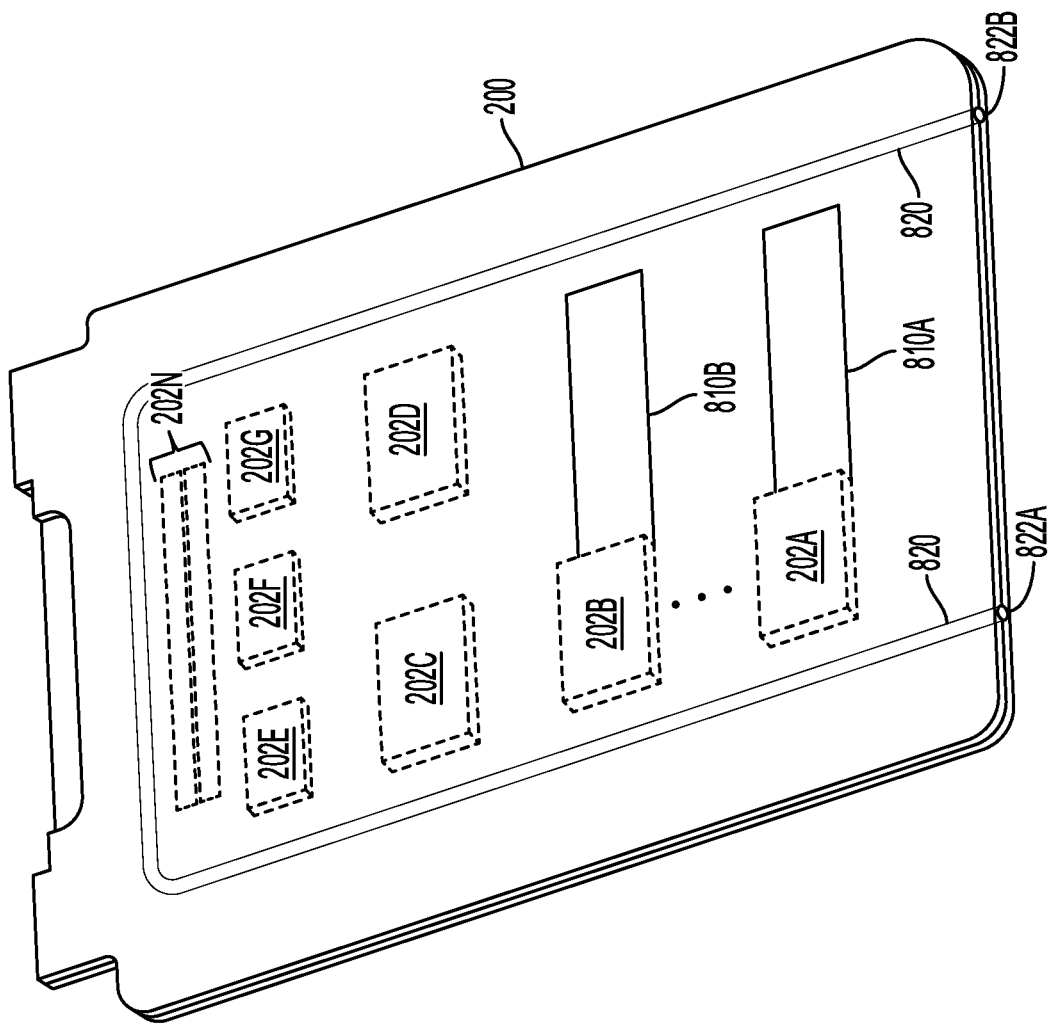
FIGS. 8 through 12 are schematic diagrams illustrating example configurations of an enhanced cold plate that uses vapor chamber for thermal management and can be implemented in an autonomous driving system computer, in accordance with some examples.

FIG. 8 is a schematic diagram illustrating an example configuration 800 of an enhanced cold plate 200 that implements vapor chambers 810A-B (collectively "810"). As illustrated, the enhanced cold plate 200 can include the vapor chambers 810 and a fluid channel 820 for removing, transferring and/or dissipating heat away from the computing components 202A-N. The vapor chambers 810 can be at least partly embedded in or coupled to the enhanced cold plate 200. In some examples, the vapor chamber 810A and the vapor chamber 810B can have the same or different sizes, shapes, and/or configurations. Moreover, in some cases, the enhanced cold plate 200 can include more or less vapor chambers 810 than shown in FIG. 8.

The vapor chambers 810 are heat-transfer or dissipation components that implement thermal conductivity and phase transition to transfer heat from one location to another. Each of the vapor chambers 810 can have liquid inside for transferring heat from a hot interface or area of the vapor chamber to a different interface or area (e.g., a colder interface or area) of the vapor chamber. The hot interface or area of the vapor chamber can absorb or collect heat from one or more of the computing components 202A-N, and the different interface or area of the vapor chamber can be further away from the one or more of the computing components 202A-N than the hot interface or area of the vapor chamber. Thus, by transferring the heat from the hot interface or area of the vapor chamber to the different interface or area, the vapor chamber can transfer heat away from such computing components, thereby providing cooling and thermal management benefits to the computing components.

For example, the liquid in each vapor chamber can evaporate into a gas as it absorbs heat from a heat source, such as heat from one or more of the computing components 202A-N. The gas can travel along the vapor chamber to the colder interface or area of the vapor chamber, moving the heat away from the heat source and the hot interface or area of the vapor chamber. The gas can then condense back into a liquid and release the latent heat. The liquid then returns to the hot interface or area through capillary action, centrifugal force, or gravity, at which point the cycle can repeat.

The type of liquid in the vapor chambers 810 can vary based on one or more factors and/or considerations. As previously mentioned, in the context of autonomous vehicles (e.g., 102), the environmental conditions and the conditions surrounding the ADSC 110 can vary and are often harsh or extreme. Thus, the properties of the liquid implemented with the vapor chambers 810 can affect the performance of the liquid in the vapor chambers 810. For example, depending on various factors environmental, implementation, and surround factors and conditions, certain liquids can lead to poor heat transfer, clogging, corrosion, and even system failure, while other liquids may have better heat transfer performance, may not clog, may limit or avoid corrosion, and may reduce the likelihood of system failure.

Thus, the type of liquid used in the vapor chambers 810 can be selected based on the properties of the liquid and the environmental, implementation, and surround conditions in which the vapor chambers 810 operate. For example, the liquid can be selected based on the properties of the liquid and the temperature in which the vapor chambers 810 will operate. Non-limiting examples of factors of a liquid that can be considered when selecting a liquid can include the liquid's compatibility with the system's metals and/or the vapor chambers 810, the liquid's thermal conductivity and specific heat, the liquid's viscosity, the liquid's freezing point, the liquid's flash point, the liquid's corrosivity, the liquid's toxicity, the liquid's thermal stability, etc. In some examples, the type of liquid selected can be a liquid determined to have compatibility with the system's metals and/or the vapor chambers 810, high thermal conductivity and specific heat, low viscosity, a low freezing point, a high flash point, low corrosivity, low toxicity, and/or thermal stability.

In some examples, the liquid used in the vapor chambers 810 can be water. In other examples, the liquid used in the vapor chambers 810 can be glycol. Moreover, non-limiting examples of other liquids can include de-ionized water, dielectric fluids, alcohol (e.g., methanol, ethanol, etc.), mercury, ammonia, water/glycol, Freon, alkali metals (e.g., cesium, potassium, sodium), refrigerant R134a, etc. In some cases, the same liquid can used in all of the vapor chambers 810. In other cases, different vapor chambers can have different types of liquids, which can vary or can be selected based on the one or more factors previously explained.

In addition to having a working fluid, each of the vapor chambers 810 can have a wick structure that can exert a capillary action on the liquid phase of the working fluid and a case (e.g., a sealed pipe or envelope) which can house the wick structure, the working fluid, and any other internal elements of the vapor chamber. The case and wick structure can be designed to be compatible with the working fluid. Moreover, the materials used to construct the case and wick structure can be selected based on some or all of the environmental, implementation, and surround factors previously described. Non-limiting example materials that can be used for the case include copper, aluminum, superalloys, etc. Moreover, non-limiting examples of wick structures include a sintered powder wick, a screen mesh wick, a grooved wick, etc.

Moreover, in some examples, the vapor chambers 810 can have internal posts, columns, rods or microchannels that help the fluid flow to a desired location (e.g., the different or colder interface or area) and/or direction. The internal posts, columns, or microchannels can also provide support for the vapor chambers 810 to help prevent the structure of the vapor chambers 810 from collapsing due to pressure and/or other forces.

In some examples, the configuration (e.g., size, length, shape, thickness, structure, etc.) of the case and wick can vary based on one or more factors such as, for example, the type of working fluid, the characteristics (e.g., layout, size, shape, materials, etc.) of the enhanced cold plate 200, the layout of the computing components 202A-N, the desired heat carrying capacity of the vapor chambers 810, the type and/or number of computing components 202A-N, the environmental and surrounding conditions where the vapor chambers 810 will operate, performance requirements or factors associated with the computing components 202A-N, and/or any other constraints that can influence the performance, stability, cost, etc., of the vapor chambers 810. Similarly, in some examples, a configuration (e.g., the size, shape, thickness, number, arrangement, etc.) of internal posts, columns, rods, or microchannels in the vapor chambers 810 can vary based on the same and/or other factors as described above.

In some examples, the configuration of the case, the wick, and/or the internal posts, columns, rods, or microchannels can depend on any constrains created by the characteristics of the enhanced cold plate 200, the layout of the computing components 202A-N, and/or a desired Qmax of the vapor chambers 810. The Qmax can be affected by various factors such as, for example, the diameter of the vapor chambers 810, the shape (e.g., flatness, roundness, curvature, amount of bending, etc.) of the vapor chambers 810, the size or length of the vapor chambers 810, the material of the casing of the vapor chambers 810, the material of the wick in the vapor chambers 810, the thickness of the wick, the porosity of the wick, the amount of working fluid, the type of working fluid, the configuration (e.g., number, size, shape, thickness, arrangement, etc.) of other internal structural elements (e.g., internal posts, columns, rods, or microchannels), etc. In some examples, the Qmax of the vapor chambers 810 can be optimized or tuned for specific operating parameters and performance characteristics by changing the configuration of internal components of the vapor chambers 810 (e.g., wick porosity, wick thickness, etc.) and/or internal structural elements (e.g., internal posts, columns, rods, or microchannels) of the vapor chambers 810, the physical characteristics of the vapor chambers 810 (e.g., the size, shape, bending, flattening, diameter, material or composition, etc.), the composition and/or materials of the vapor chambers 810, etc.

The number of vapor chambers 810 implemented in the enhanced cold plate 200 can vary in different examples. The number of vapor chambers 810 can be selected based on one or more factors such as, for example, the number and/or type of computing components 202A-N associated with the enhanced cold plate 200, the performance requirements of the ADSC 110 and/or the computing components 202A-N, heat and power conditions associated with the ADSC 110 and computing components 202A-N, stability considerations associated with the ADSC 110 and computing components 202A-N, the configuration (e.g., size, shape, thickness, length, structure, etc.) of the enhanced cold plate 200, environmental factors, the layout of the computing components 202A-N, the configuration of each of the vapor chambers 810, the Qmax characteristics of the vapor chambers 810, etc. Moreover, the layout, arrangement, position, and/or shape of the vapor chambers 810 can also vary based on one or more factors, as further described herein.

In some examples, one or more surfaces or sides of the vapor chambers 810 can be flat or partly flat. Moreover, in some cases, one or more of the vapor chambers 810 can be horizontal vapor chambers. In other cases, one or more of the vapor chambers 810 can be vertical vapor chambers. Further, each of the vapor chambers 810 can dissipate or transfer heat in multiple dimensions or directions. In some examples, internal posts, rods, columns, or microchannels can help dissipate or transfer the heat in the multiple dimensions or directions.

As previously mentioned, in addition to including vapor chambers 810, the enhanced cold plate 200 can include a fluid channel 820 for removing, transferring, dissipating, etc., heat away from the computing components 202A-N. Moreover, the fluid channel 820 can also remove, transfer, dissipate, etc., heat transferred or collected from the vapor chambers 810, as further explained herein. The fluid channel 820 can include a fluid that can flow from a fluid ingress point 822A to a fluid egress point 822B. The fluid ingress point 822A and fluid egress point 822B can include ports where the fluid enters and exits the fluid channel 820, interfaces connecting the fluid channel 820 with tubes, hoses, or pipes that supply the fluid to the fluid channel 820 or points where a tube, hose or pipe of the fluid channel 820 enters and exits the enhanced cold plate 200 from and to a different location on the ADSC 110 (e.g., from and to a different enhanced cold plate, from and to a reservoir, from and to a pump, etc.), etc.

The fluid in the fluid channel 820 can be the same type of fluid as the working fluid in the vapor chambers 810 or a different type of fluid. In some examples, the fluid in the fluid channel 820 can include water. In other examples, the fluid in the fluid channel 820 can include glycol. In yet other examples, the fluid channel 820 can be used as a channel for air instead of fluid. The air can be circulated through the fluid channel 820 to transfer, remove, and/or dissipate heat.

The shape, configuration, layout and placement/positioning of the fluid channel 820 and the vapor chambers 810 can vary in different implementations. In the example configuration 800 shown in FIG. 8, the vapor chambers 810 have a linear configuration and are coupled to computing components 202A and 202B. As shown, the vapor chamber 810A is coupled to computing component 202A in order to transfer heat away from the computing component 202A, and the vapor chamber 810B is coupled to computing component 202B in order to transfer heat away from the computing component 202B. The computing components 202A and 202B in this example can be any of the computing components 202 previously described. For example, the computing components 202A and 202B can be CPUs, GPUs, or any other electronic computing component.

Further, the fluid channel 820 has a u-shape and surrounds the computing components 202A-N. Thus, the fluid in the fluid channel 820 can flow from the fluid ingress point 822A, around the computing components 202A-N, until exiting at the fluid egress point 822B. As the fluid travels through the fluid channel 820, the fluid can absorb or collect heat from the computing components 202A-N and carry the heat away from the computing components 202A-N until exiting at the fluid egress point 822B. Similarly, as the fluid travels by the vapor chambers 810A and 810B, the fluid can absorb heat transferred or dissipated from the vapor chambers 810A and 810B, and transfer the heat away from the vapor chambers 810A and 810B until exiting at the fluid egress point 822B. This cycle can repeat as fluid continues to flow or circulate around the fluid channel 820, again exiting at the fluid egress point 822B. In this way, the fluid channel 820 can enhance the cooling or thermal management features of the vapor chambers 810A and 810B, and vice versa.

In some cases, the fluid channel 820 can include, implement and/or couple to one or more heat sinks. For example, one or more heat sinks can be coupled to an internal or external surface of the fluid channel 820. The one or more heat sinks can help dissipate heat collected by the fluid channel 820.

While FIG. 8 shows the fluid ingress point 822A located on an end of the enhanced cold plate 200 closer to the computing components 202A-B relative to the fluid egress point 822B, and the fluid egress point 822B located on an end of the enhanced cold plate 200 that is closer to the vapor chambers 810 relative to the fluid ingress point 822A, it should be noted that this arrangement is merely an example provided for explanation purposes. In other examples, the fluid ingress point 822A and/or the fluid egress point 822B can be located elsewhere in the enhanced cold plate 200.

For example, in some cases, the fluid ingress point 822A can be located where the fluid egress point 822B is currently shown in FIG. 8, and the fluid egress point 822B can be located where the fluid ingress point 822A is currently shown in FIG. 8, such that their location is reversed and, as a result, the fluid in the fluid channel 820 flows in the opposite/reverse direction. In another example, the fluid ingress point 822A and/or the fluid egress point 822B can be located on a different side of the enhanced cold plate 200 than shown in FIG. 8 and/or different sides of the enhanced cold plate 200 relative to each other.

Figure 9:
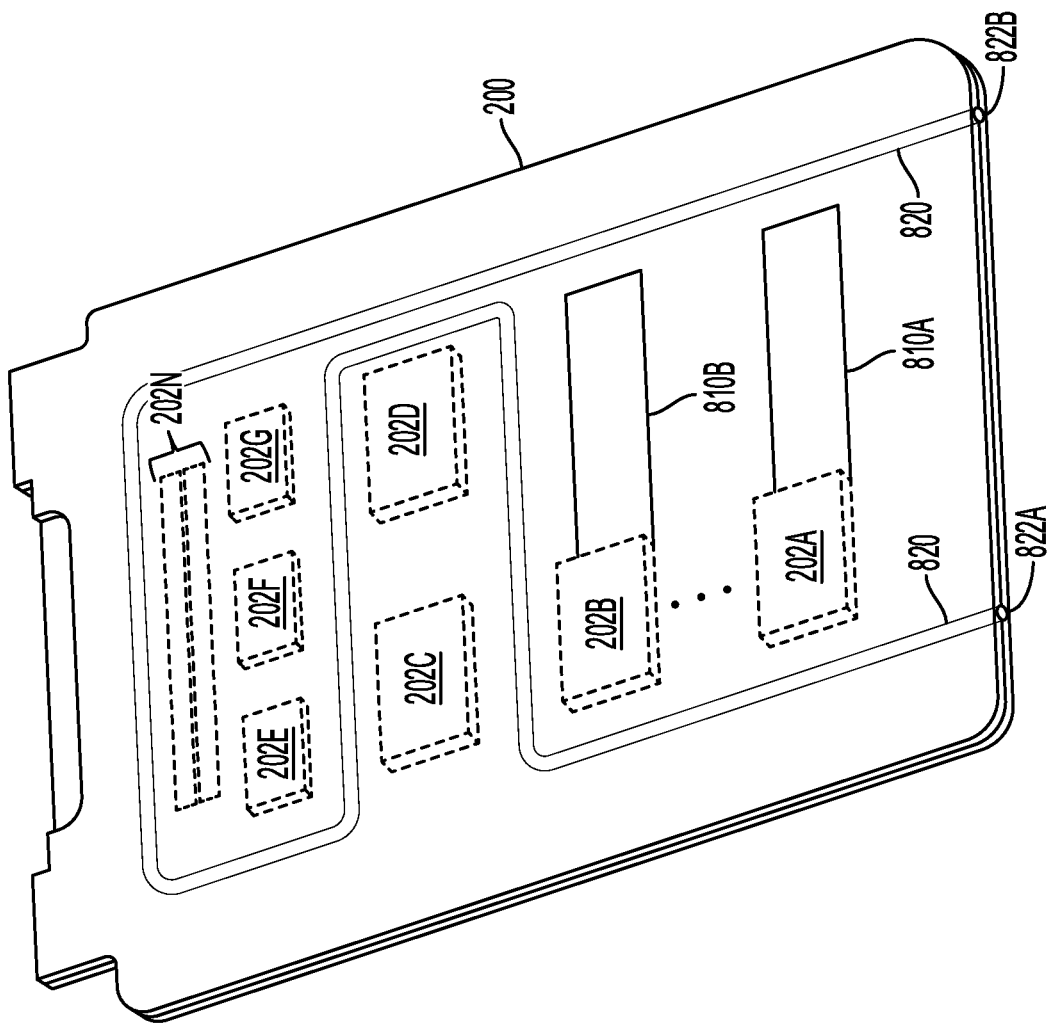

FIG. 9 is a schematic diagram illustrating another example configuration 900 of the enhanced cold plate 200 with the vapor chambers 810. In this example, the fluid channel 820 has a different shape as the u-shape shown in FIG. 8. In particular, instead of continuing past an outer side of computing component 202C (the side opposite to computing component 202D), the fluid channel 820 turns before the computing component 202C and goes around computing components 202C and 202D in a u-shape until returning to an outer side of computing component 202E (the side opposite to computing components 202F and 202G). The fluid channel 820 then continues along the u-shape trajectory as previously shown in FIG. 8.

This layout of the fluid channel 820 can vary how heat is transferred or collected from the computing components 202C and 202D. Moreover, the layout of the fluid channel 820 can take into account specific constraints or requirements regarding fluid channel coverage, available or unobstructed space in the enhanced cold plate 200, the layout/arrangement of components/objects on the enhanced cold plate 200 (e.g., computing components 202A-N and/or any other objects or components), thermal management requirements of the ADSC 110 and/or any of the computing components 202A-N, heat transfer capabilities and/or performance of the fluid channel 820 and/or the vapor chambers 810, and/or any other constraints or factors.

Figure 10:
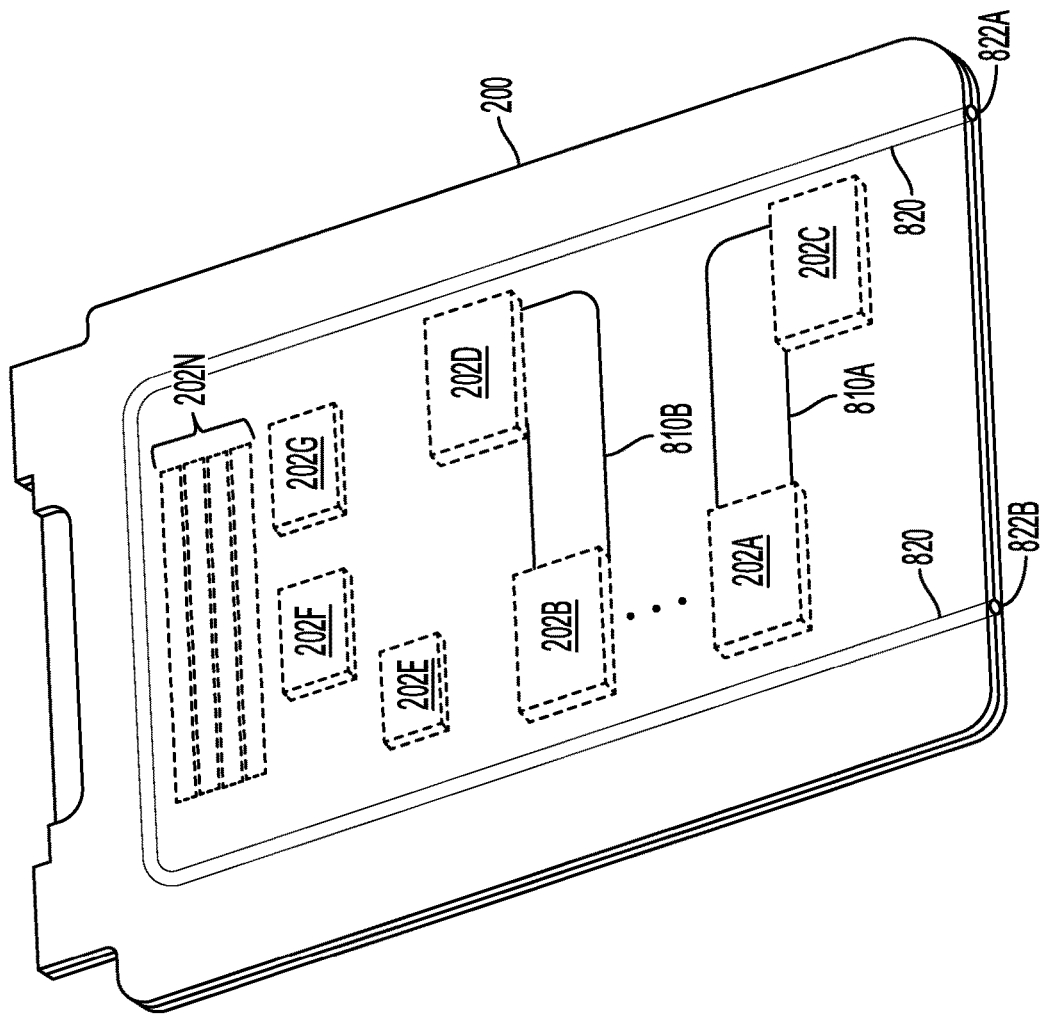

FIG. 10 is a schematic diagram illustrating another example configuration 1000 of the enhanced cold plate 200 and vapor chambers 810. In this example, the locations of the fluid ingress point 822A and the fluid egress point 822B are reversed with respect to their locations shown in FIGS. 8 and 9. Consequently, the flow of fluid in the fluid channel 820 is similarly reversed relative to the flow in FIGS. 8 and 9.

In addition, the arrangement of the computing components 202A-N has changed so that computing component 202C is now partly across from computing component 202A (as opposed to adjacent to computing component 202B as shown in FIGS. 8 and 9) and computing component 202D is partly across from computing component 202B. To account for the different arrangement of computing components 202C and 202D and/or provide different thermal management properties, the shape of the vapor chambers 810 has also changed. Here, the vapor chambers 810 are shown with a partial bend or curve.

In particular, the vapor chambers 810A are now coupled at opposite ends to both computing components 202A and 202C. Given the arrangement of the computing components 202A and 202C, this coupling of the vapor chambers 810A to both of the computing components 202A and 202C is enabled by the partial bend or curve of the vapor chambers 810A. Moreover, this coupling of the vapor chambers 810A can allow the vapor chambers 810A to take heat away from both of the computing components 202A and 202C.

Similarly, the vapor chambers 810B are now coupled at opposite ends to both computing components 202B and 202D. As previously explained, given the arrangement of the computing components 202B and 202D, this coupling of the vapor chambers 810B to both of the computing components 202A and 202C is enabled by the partial bend or curve of the vapor chambers 810B. Moreover, this coupling of the vapor chambers 810B can allow the vapor chambers 810B to take heat away from both of the computing components 202B and 202D.

As illustrated in FIG. 10, the shape of the vapor chambers 810 can vary to account for a specific arrangement of components on the enhanced cold plate 200. The direction of the flow of fluid in the fluid channel 820 can also change as needed.

Figure 11:
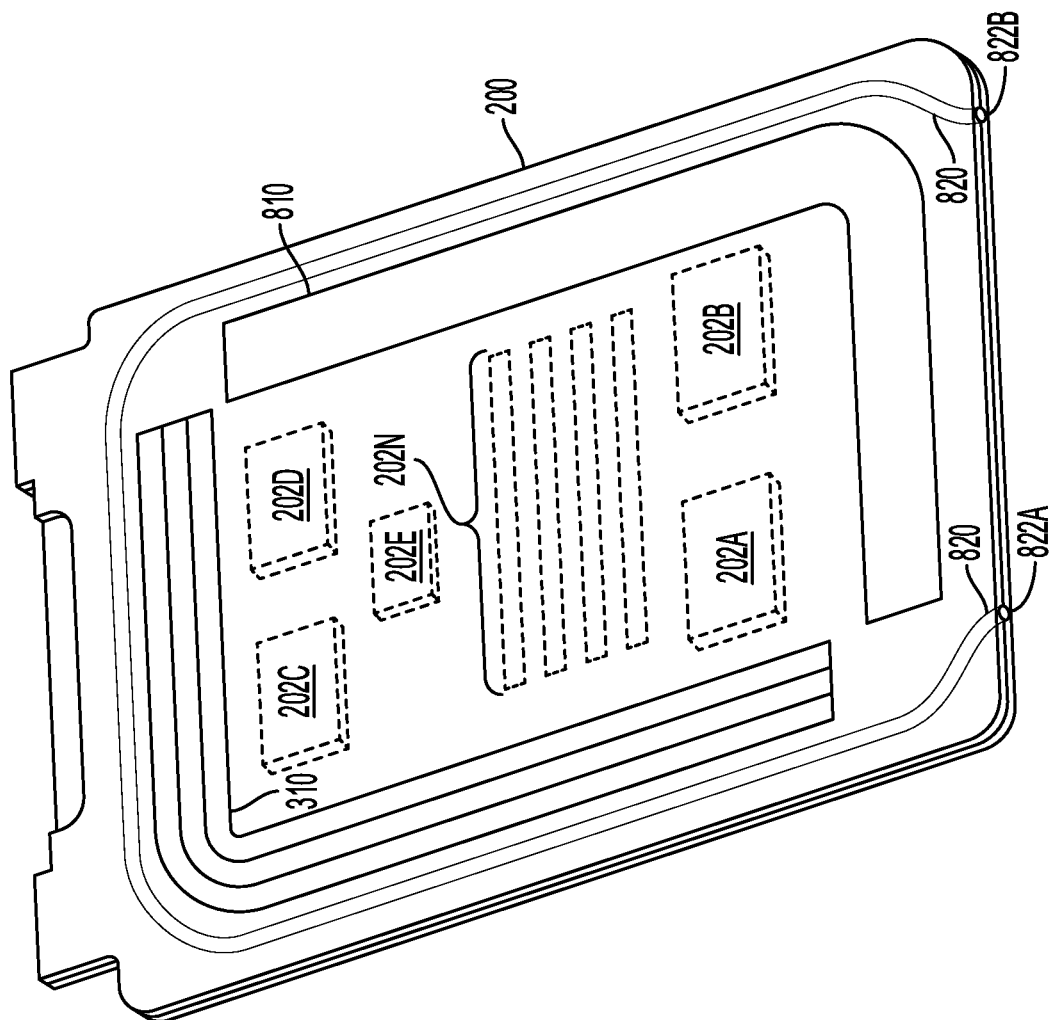

FIG. 11 is a schematic diagram illustrating another example configuration 1100 of the enhanced cold plate 200 including a combination of heat pipes 310 and a vapor chamber 810. Moreover, in the example configuration 1100, the vapor chamber 810 has a different shape, size and arrangement than the vapor chambers 810A and 810B shown in FIGS. 8-10 arrangement.

In this example, the heat pipes 310 and the vapor chamber 810 have an L-shape and are arranged to form a rectangle or square. Moreover, the heat pipes 310 and the vapor chamber 810 surround the computing components 202A-N such that the computing components 202A-N are contained within the rectangle or square formed by the arrangement of the heat pipes 310 and the vapor chamber 810. The heat pipes 310 and the vapor chamber 810 can collect heat from the computing components 202A-N and transfer the heat away from the computing components 202A-N to provide cooling to the computing components 202A-N.

The enhanced cold plate 200 also includes a fluid channel 820 configured in a u-shape surrounding the heat pipes 310, the vapor chamber 810 and the computing components 202A-N. The fluid channel 820 can include fluid that circulates from the fluid ingress point 822A, around the heat pipes 310 and the vapor chamber 810 (and the computing components 202A-N), until exiting through the fluid egress point 822B. As the fluid circulates around the fluid channel 820, the fluid can collect heat from the heat pipes 310 and the vapor chamber 810 and transfer the heat away from the heat pipes 310 and the vapor chamber 810 (and the computing components 202A-N) to provide further cooling of the computing components 202A-N.

Figure 12:
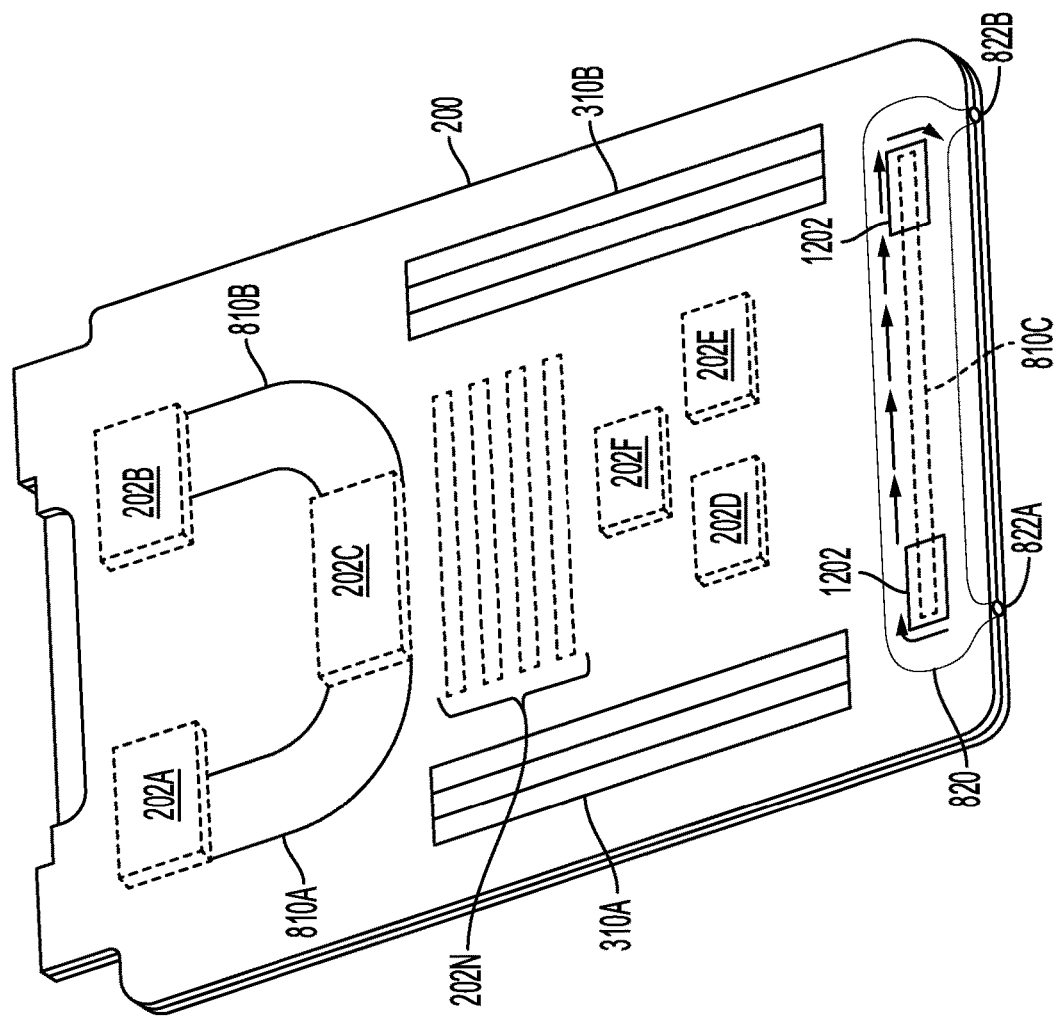

FIG. 12 is a schematic diagram illustrating another example configuration 1200 of the enhanced cold plate 200 including multiple heat pipes 310 and vapor chambers 810. In this example, the enhanced cold plate 200 includes two sets of heat pipes 310A-B arranged parallel or adjacent to computing components 202D, 202E, 202F and 202N. Each of the sets of heat pipes 310A-B can include one or more heat pipes. Moreover, the sets of heat pipes 310A-B can dissipate heat away from the computing components 202D, 202E, 202F, and 202N.

The enhanced cold plate 200 also includes a vapor chamber 810A coupled to computing components 202A and 202C on opposite ends, and a vapor chamber 810B coupled to computing components 202B and 202C on opposite ends. The vapor chambers 810A-B can help dissipate and/or transfer heat away from the computing components 202A-C.

The enhanced cold plate 200 also includes a vapor chamber 810C embedded, contained, or implemented within a fluid channel 820. The vapor chamber 810C can help dissipate and/or transfer heat away from the computing components 202A-N. Moreover, fluid in the fluid channel 820 can collect heat from the vapor chamber 810C and dissipate and/or transfer the heat away. In some examples, the fluid in the fluid channel 820 can also help dissipate and/or transfer heat away from the computing components 202A-N.

The fluid channel 820 in this example has a linear shape and is located on an end of the enhanced cold plate 200. Fluid in the fluid channel 820 can circulate from a fluid ingress point 822A and around the vapor chamber 810C until exiting at a fluid egress point 822B. In some examples, the fluid in the fluid channel 820 can surround or engulf the vapor chamber 810B in the fluid channel 820. In some cases, the fluid channel 820 can include heat sinks 1202, which can help dissipate heat from the vapor chamber 810C and/or the computing components 202A-N. In some examples, the fluid channel 820 can include a single heat sink for enhancing thermal management benefits. In other examples, the fluid channel 820 can include multiple heat sinks.

In some cases, the heat sinks 1202 can be coupled to an exterior surface of the fluid channel 820 and/or the enhanced cold plate 200. In other examples, the heat sinks 1202 can be enclosed within the fluid channel 820. Moreover, in some cases, the heat sinks 1202 can be directly or indirectly coupled to the vapor chamber 810C in the fluid channel 820. For example, the heat sinks 1202 can be coupled to, and/or in contact with, different portions of the vapor chamber 810C.

In some examples, the sets of heat pipes 310A can dissipate heat away from the computing components 202A-C. The dissipated heat (as well as heat from the other computing components 202D-N) can move towards the vapor chamber 810C and the fluid channel 820. The vapor chamber 810C can collect the heat to transfer the heat away from the computing components 202A-N. The fluid in the fluid channel 820 and the heat sinks 1202 can then further help dissipate and/or transfer the heat away from the computing components 202A-N and/or the vapor chamber 810C.

While the fluid channel 820 and the vapor chamber 810C in the fluid channel 820 are shown in FIG. 12 in a linear configuration/shape, it should be noted that such configuration/shape is provided herein as an example for explanation purposes. In other examples, the enhanced cold plate 200 can implement one or more fluid channels containing or housing one or more vapor chambers, and the one or more fluid channels and/or the one or more vapor chambers contained or housed in the one or more fluid channels can have a different size, shape, arrangement, configuration, etc.

Moreover, in some examples, the enhanced cold plate 200 shown in FIGS. 8-12 can have other cooling components or combinations of cooling components than those shown in FIGS. 8-12. For example, in some cases, the enhanced cold plate 200 can include a fan in combination with one or more vapor chambers and/or heat pipes.

Figure 13A:
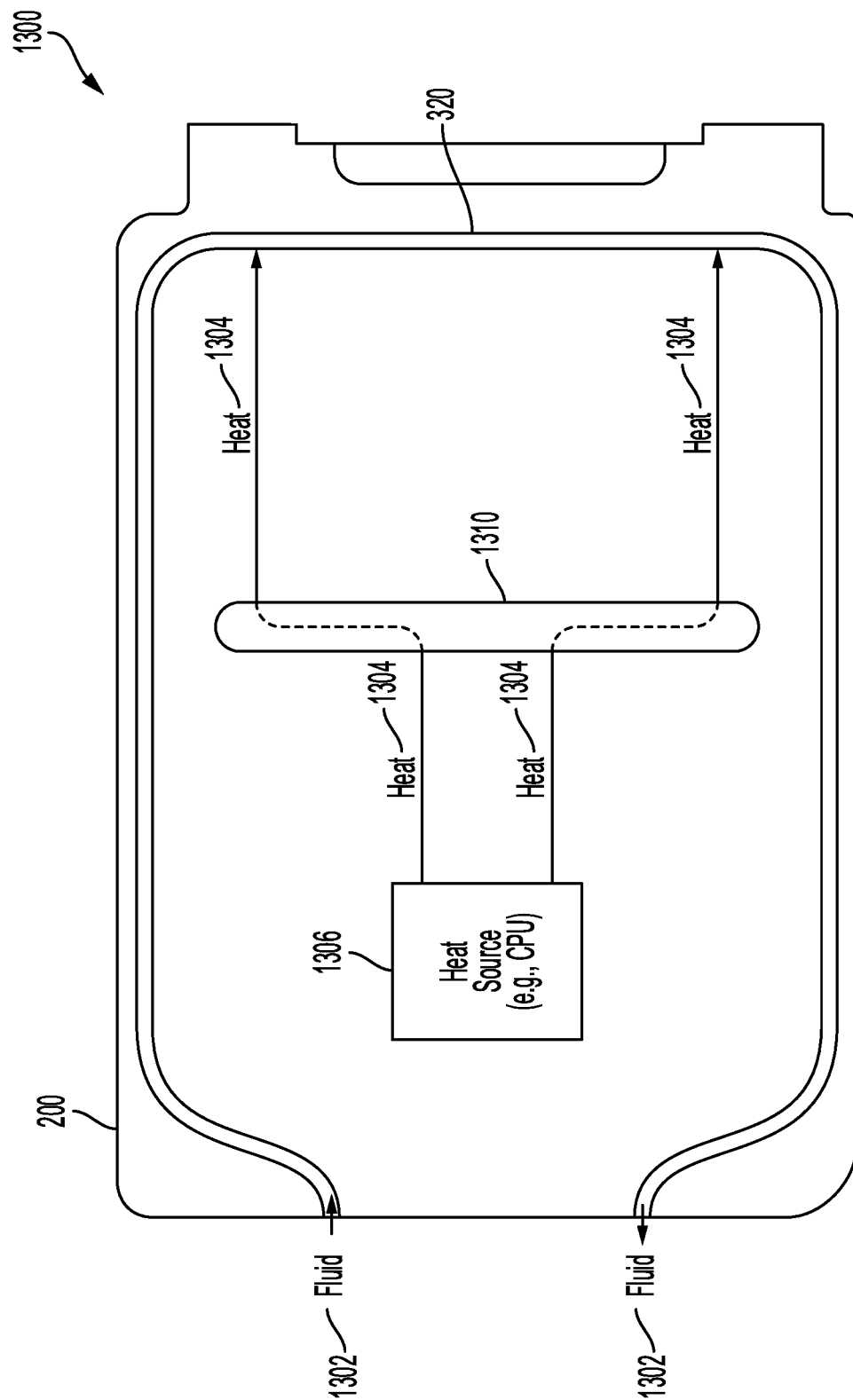
FIGS. 13A and 13B are diagrams illustrating example heat management flows in example enhanced cold plates for an autonomous driving system computer, in accordance with some examples.

FIG. 13A is a diagram illustrating an example heat management flow 1300 in an enhanced cold plate 200 implemented by the ADSC 110 and having an example configuration. In this example, a heat source 1306 on the enhanced cold plate 200 first generates and emits heat 1304. The heat source 1306 can include one or more of the computing components 202A-N previously described.

A heat management component 1310 implemented by the enhanced cold plate 200 can collect the heat 1304 and dissipate and/or transfer the heat 1304 away from the heat source 1306 and towards the fluid channel 320 implemented by the enhanced cold plate 200. The heat management component 1310 can include, for example, a heat pipe (e.g., 310) or a vapor chamber (e.g., 810).

The fluid channel 320 can collect and/or absorb the heat 1304 dissipated and/or transferred by the heat management component 1310, and dissipate and/or transfer the heat 1304 through a fluid 1302 that circulates around the fluid channel 320. The fluid 1302 can circulate around the fluid channel 320 in various cycles, while collecting, absorbing, dissipating, and/or transferring heat in each cycle.

Figure 13B:
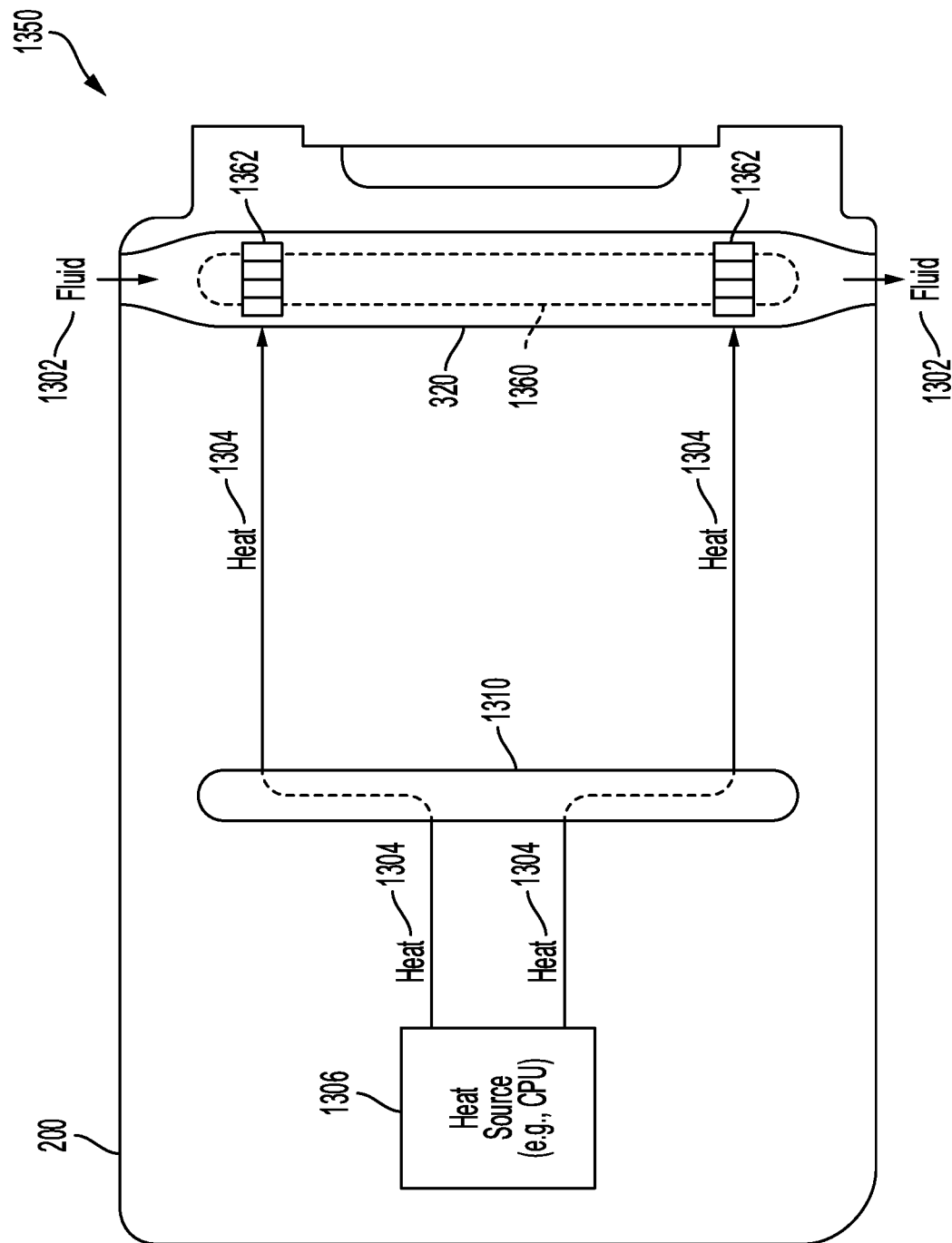

FIG. 13B is a diagram illustrating another example heat management flow 1350 in an enhanced cold plate 200 implemented by the ADSC 110 and having a different example configuration than the enhanced cold plate 200 shown in FIG. 13A. In this example, the heat source 1306 similarly emits heat 1304, which can be collected and/or absorbed by the heat management component 1310 and dissipated and/or transferred by the heat management component 1310 away from the heat source 1306 and towards a fluid channel 320 containing another heat management component 1360.

The heat management component 1360 in the fluid channel 320 can include a heat pipe (e.g., 310) or a vapor chamber (e.g., 810). The heat management component 1360 can be adjacent to, surrounded by, or engulfed by fluid 1302 in the fluid channel 320. The fluid 1302 in the fluid channel 320 and/or the heat management component 1360 in the fluid channel 320 can collect and/or absorb the heat 1304 from the heat management component 1310. Moreover, the fluid 1302 and/or the heat management component 1360 can transfer the heat 1304 to heat sinks 1362, which can dissipate the heat received by the heat sinks 1362. In some examples, the fluid 1302 can also transfer at least some of the heat 1304 out of the enhanced cold plate 200 when it exits the enhanced cold plate 200 through a fluid egress point (e.g., 322B, 822B).

While the heat management component 1310 (FIG. 13A) or 1360 (FIG. 13B) is shown as a single component, it should be understood that, in other examples, the heat management component 1310 or 1360 can include multiple components. For example, in some cases, the heat management component 1310 or 1360 can include one or more heat pipes and/or one or more vapor chambers.

Figure 14:
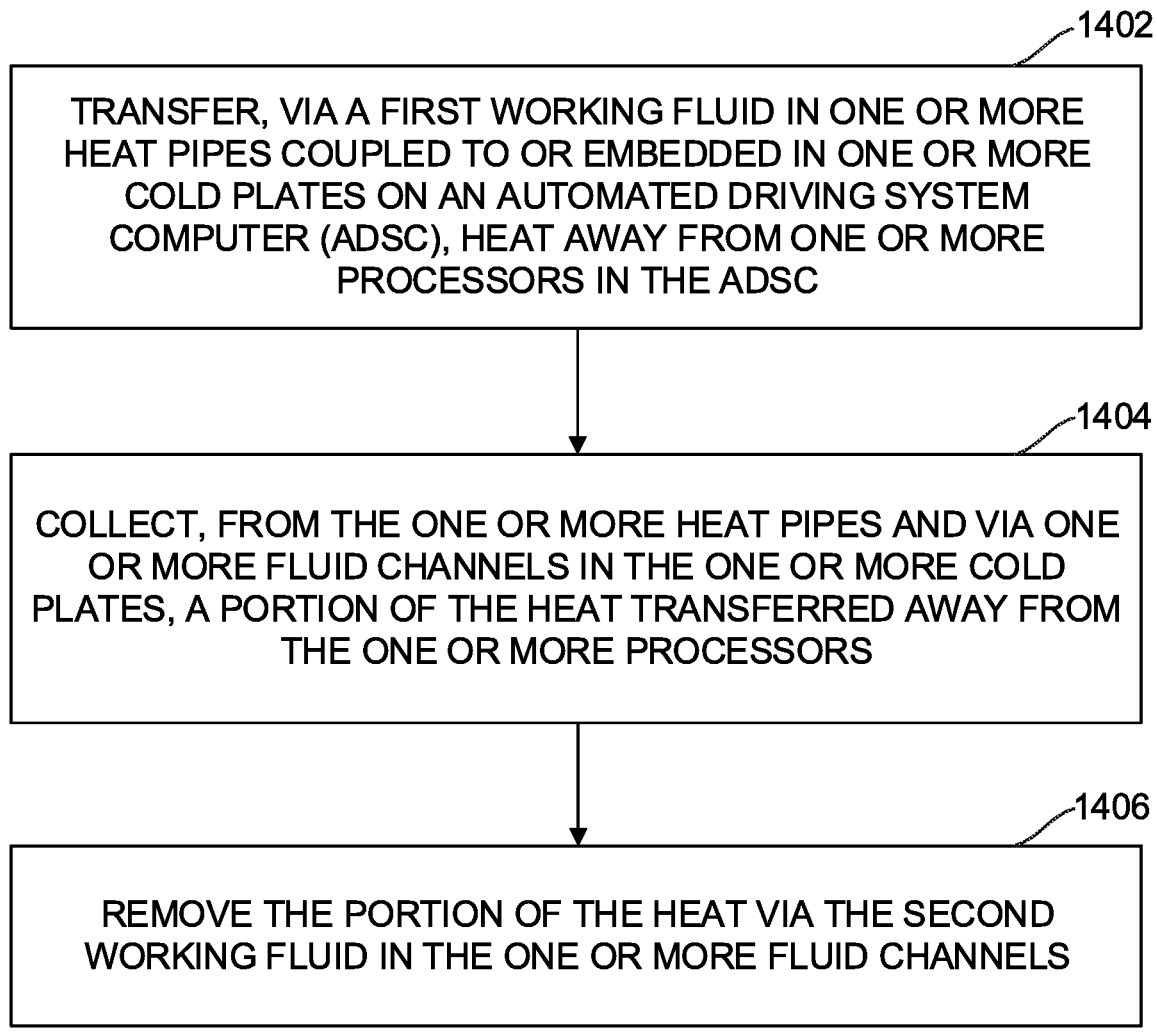
FIGS. 14 and 15 illustrate example methods for thermal management using enhanced cold plates for automated driving system computers, in accordance with some examples.
Figure 15:
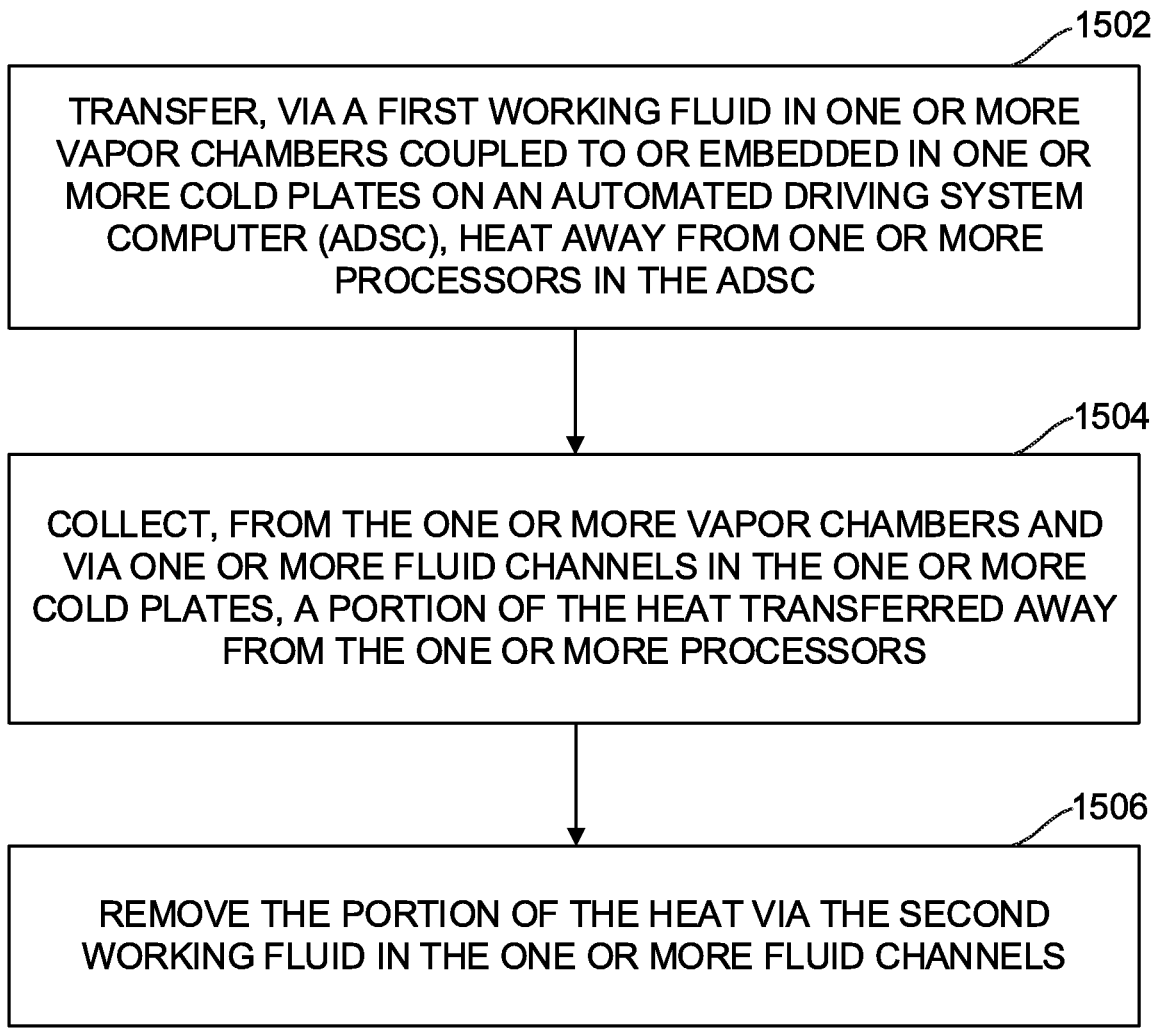
Figure 16:
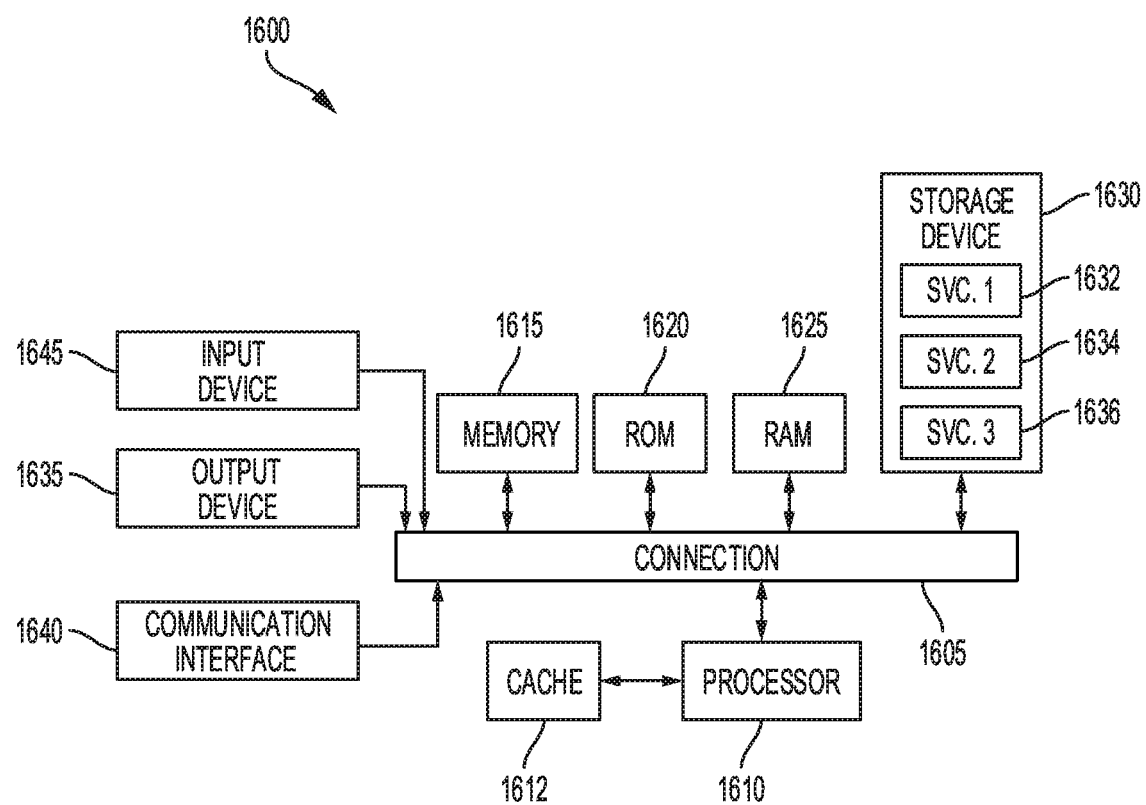
FIG. 16 illustrates an example computing system architecture for implementing various aspects of the present technology.

Having disclosed some example system components and concepts, the disclosure now turns to FIGS. 14 and 15, which illustrate example methods 1400 and 1500 for thermal management in automated driving system computers. The steps outlined herein are exemplary and can be implemented in any combination thereof, including combinations that exclude, add, or modify certain steps.

At block 1402, the method 1400 can include transferring, via a first working fluid in one or more heat pipes (e.g., 310) coupled to or embedded in one or more cold plates (e.g., 200) on an ADSC (e.g., 110), heat away from one or more processors (e.g., 202A, 202B, 202C, 202D, 202F, 202G, and/or 202N) in the ADSC. In some cases, the one or more heat pipes can include a single heat pipe. In other cases, the one or more heat pipes can include a plurality of heat pipes.

Moreover, in some examples, the one or more heat pipes can be coupled to the one or more cold plates. In other examples, the one or more heat pipes can be embedded in (or within) the one or more cold plates. For example, the one or more heat pipes can be embedded in or within the one or more cold plates.

In some cases, the one or more heat pipes can be coupled to the one or more processors, and the one or more fluid channels can be embedded in the one or more cold plates and can run through an inside portion of the one or more cold plates.

In some examples, the ADSC can be coupled to an autonomous vehicle (e.g., 102) and configured to perform one or more operations of the autonomous vehicle. Moreover, the ADSC can be housed in and/or implemented by the autonomous vehicle, as further described above with respect to FIG. 1.

In some examples, the one or more cold plates can also include one or more vapor chambers (e.g., 810) coupled to or embedded in the one or more cold plates and configured to collect heat from the one or more processors and/or one or more electronic components (e.g., 202A, 202B, 202C, 202D, 202F, 202G, and/or 202N), and transfer the heat away from the one or more processors and/or the one or more electronic components via a third working fluid in the one or more vapor chambers.

At block 1404, the method 1400 can include collecting, from the one or more heat pipes and via one or more fluid channels (e.g., 320) in the one or more cold plates, a portion of the heat transferred away from the one or more processors. In some examples, the one or more fluid channels can be configured to circulate a second working fluid from a respective fluid ingress point (e.g., 322A) to a respective fluid egress point (e.g., 322B). The second working fluid in the one or more fluid channels can dissipate the portion of the heat, remove the portion of the heat, and/or transfer the portion of the heat away and/or towards another location such as a colder location.

In some examples, the one or more fluid channels can be configured to collect heat from the one or more processors and/or the one or more heat pipes and transfer the heat away from the one or more processors and/or the one or more heat pipes.

At block 1406, the method 1400 can include removing the portion of the heat via the second working fluid in the one or more fluid channels. In some examples, removing the portion of the heat via the second working fluid in the one or more fluid channels can include dissipating the portion of the heat via the second working fluid in the one or more fluid channels, one or more additional heat pipes contained in the one or more fluid channels, and/or one or more heat sinks associated with (e.g., coupled to or contained within) the one or more fluid channels.

In some aspects, the method 1400 can include collecting, via at least one of the one or more heat pipes, heat from one or more electronic components (e.g., 202A, 202B, 202C, 202D, 202F, 202G, and/or 202N) in the ADSC to yield a portion of collected heat, and transferring the portion of collected heat away from the one or more electronic components via the at least one of the one or more heat pipes. In some aspects, the method 1400 can further include collecting the portion of collected heat via the one or more fluid channels, and dissipating the portion of collected heat via the second working fluid in the one or more fluid channels and/or one or more heat sinks implemented with the one or more fluid channels.

In some examples, the one or more electronic components can include a circuit board, a memory, a field-programmable gate array, an application-specific integrated circuit, a storage device, a system-on-chip, and/or power electronics. Moreover, in some examples, the one or more processors can include a central processing unit, a graphics processing unit, and/or a digital signal processor.

In some aspects, the method 1400 can include collecting, via one or more additional heat pipes contained within the one or more fluid channels, at least part of the heat transferred away from the one or more processors to yield a portion of collected heat, and transferring the portion of collected heat via the second working fluid in the one or more fluid channels. In some examples, transferring the portion of collected heat via the second working fluid in the one or more fluid channels can include dissipating at least some of the portion of collected heat via one or more heat sinks (e.g., 702) coupled to the one or more fluid channels and/or the one or more additional heat pipes contained within the one or more fluid channels.

FIG. 15 illustrates another example method 1500 for thermal management in automated driving system computers. At block 1502, the method 1500 can include transferring, via a first working fluid in one or more vapor chambers (e.g., 810) coupled to or embedded in one or more cold plates (e.g., 200) on an ADSC (e.g., 110), heat away from one or more processors (e.g., 202A, 202B, 202C, 202D, 202F, 202G, and/or 202N) in the ADSC. In some cases, the one or more vapor chambers can include a single vapor chamber. In other cases, the one or more vapor chambers can include a plurality of vapor chambers.

Moreover, in some examples, the one or more vapor chambers can be coupled to the one or more cold plates. In other examples, the one or more vapor chambers can be embedded in (or within) the one or more cold plates. For example, the one or more vapor chambers can be embedded in or within the one or more cold plates.

In some cases, the one or more vapor chambers can be coupled to the one or more processors, and the one or more fluid channels can be embedded in the one or more cold plates and can run through an inside portion of the one or more cold plates.

In some examples, the ADSC can be coupled to an autonomous vehicle (e.g., 102) and configured to perform one or more operations of the autonomous vehicle. Moreover, the ADSC can be housed in and/or implemented by the autonomous vehicle, as further described above with respect to FIG. 1.

In some examples, the one or more cold plates can also include one or more heat pipes (e.g., 310) coupled to or embedded in the one or more cold plates and configured to collect heat from the one or more processors and/or one or more electronic components (e.g., 202A, 202B, 202C, 202D, 202F, 202G, and/or 202N), and transfer the heat away from the one or more processors and/or the one or more electronic components via a third working fluid in the one or more heat pipes.

At block 1504, the method 1500 can include collecting, from the one or more vapor chambers and via one or more fluid channels (e.g., 320) in the one or more cold plates, a portion of the heat transferred away from the one or more processors. In some examples, the one or more fluid channels can be configured to circulate a second working fluid from a respective fluid ingress point (e.g., 822A) to a respective fluid egress point (e.g., 822B). The second working fluid in the one or more fluid channels can dissipate the portion of the heat, remove the portion of the heat, and/or transfer the portion of the heat away and/or towards another location such as a colder location.

In some examples, the one or more fluid channels can be configured to collect heat from the one or more processors and/or the one or more vapor chambers and transfer the heat away from the one or more processors and/or the one or more vapor chambers.

At block 1506, the method 1500 can include removing the portion of the heat via the second working fluid in the one or more fluid channels. In some examples, removing the portion of the heat via the second working fluid in the one or more fluid channels can include dissipating the portion of the heat via the second working fluid in the one or more fluid channels, one or more additional vapor chambers contained in the one or more fluid channels, and/or one or more heat sinks associated with (e.g., coupled to or contained within) the one or more fluid channels.

In some aspects, the method 1500 can include collecting, via at least one of the one or more vapor chambers, heat from one or more electronic components (e.g., 202A, 202B, 202C, 202D, 202F, 202G, and/or 202N) in the ADSC to yield a portion of collected heat, and transferring the portion of collected heat away from the one or more electronic components via the at least one of the one or more vapor chambers. In some aspects, the method 1500 can further include collecting the portion of collected heat via the one or more fluid channels, and dissipating the portion of collected heat via the second working fluid in the one or more fluid channels and/or one or more heat sinks implemented with the one or more fluid channels.

In some examples, the one or more electronic components can include a circuit board, a memory, a field-programmable gate array, an application-specific integrated circuit, a storage device, a system-on-chip, and/or power electronics. Moreover, in some examples, the one or more processors can include a central processing unit, a graphics processing unit, and/or a digital signal processor.

In some aspects, the method 1500 can include collecting, via one or more additional vapor chambers contained within the one or more fluid channels, at least part of the heat transferred away from the one or more processors to yield a portion of collected heat, and transferring the portion of collected heat via the second working fluid in the one or more fluid channels. In some examples, transferring the portion of collected heat via the second working fluid in the one or more fluid channels can include dissipating at least some of the portion of collected heat via one or more heat sinks (e.g., 1202) coupled to the one or more fluid channels and/or the one or more additional vapor chambers contained within the one or more fluid channels.

As described herein, one aspect of the present technology includes gathering and using data available from various sources to improve quality and experience. The present disclosure contemplates that in some instances, this gathered data may include personal information. The present disclosure contemplates that the entities involved with such personal information respect and value privacy policies and practices.

FIG. 16 illustrates an example computing system 1600 which can be, for example, any computing device making up ADSC 110, remote computing system 150, a passenger device executing rideshare application 170, or any other computing device. In FIG. 16, the components of the computing system 1600 are in communication with each other using connection 1605. Connection 1605 can be a physical connection via a bus, or a direct connection into processor 1610, such as in a chipset architecture. Connection 1605 can also be a virtual connection, networked connection, or logical connection.

In some embodiments, computing system 1600 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 1600 includes at least one processing unit (CPU or processor) 1610 and connection 1605 that couples various system components including system memory 1615, such as read-only memory (ROM) 1620 and random access memory (RAM) 1625 to processor 1610. Computing system 1600 can include a cache of high-speed memory 1612 connected directly with, in close proximity to, or integrated as part of processor 1610.

Processor 1610 can include any general purpose processor and a hardware service or software service, such as services 1632, 1634, and 1636 stored in storage device 1630, configured to control processor 1610 as well as a special-purpose processor where software instructions are incorporated into the actual processor design. Processor 1610 may essentially be a completely self-contained computing system, containing multiple cores or processors, a bus, memory controller, cache, etc. A multi-core processor may be symmetric or asymmetric.

To enable user interaction, computing system 1600 includes an input device 1645, which can represent any number of input mechanisms, such as a microphone for speech, a touch-sensitive screen for gesture or graphical input, keyboard, mouse, motion input, speech, etc. Computing system 1600 can also include output device 1635, which can be one or more of a number of output mechanisms known to those of skill in the art. In some instances, multimodal systems can enable a user to provide multiple types of input/output to communicate with computing system 1600. Computing system 1600 can include communications interface 1640, which can generally govern and manage the user input and system output. There is no restriction on operating on any particular hardware arrangement, and therefore the basic features here may easily be substituted for improved hardware or firmware arrangements as they are developed.

Storage device 1630 can be a non-volatile memory device and can be a hard disk or other types of computer readable media which can store data that are accessible by a computer, such as magnetic cassettes, flash memory cards, solid state memory devices, digital versatile disks, cartridges, random access memories (RAMs), read-only memory (ROM), and/or some combination of these devices.

The storage device 1630 can include software services, servers, services, etc., that when the code that defines such software is executed by the processor 1610, it causes the system to perform a function. In some embodiments, a hardware service that performs a particular function can include the software component stored in a computer-readable medium in connection with the necessary hardware components, such as processor 1610, connection 1605, output device 1635, etc., to carry out the function.

For clarity of explanation, in some instances, the present technology may be presented as including individual functional blocks including functional blocks comprising devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in memory of a client device and/or one or more servers of a content management system and perform one or more functions when a processor executes the software associated with the service. In some embodiments, a service is a program or a collection of programs that carry out a specific function. In some embodiments, a service can be considered a server. The memory can be a non-transitory computer-readable medium.

In some embodiments, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer-readable media. Such instructions can comprise, for example, instructions and data which cause or otherwise configure a general purpose computer, special purpose computer, or special purpose processing device to perform a certain function or group of functions. Portions of computer resources used can be accessible over a network. The executable computer instructions may be, for example, binaries, intermediate format instructions such as assembly language, firmware, or source code. Examples of computer-readable media that may be used to store instructions, information used, and/or information created during methods according to described examples include magnetic or optical disks, solid-state memory devices, flash memory, USB devices provided with non-volatile memory, networked storage devices, and so on.

Devices implementing methods according to these disclosures can comprise hardware, firmware and/or software, and can take any of a variety of form factors. Typical examples of such form factors include servers, laptops, smartphones, small form factor personal computers, personal digital assistants, and so on. The functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

Claim language reciting "at least one of" a set indicates that one member of the set or multiple members of the set satisfy the claim. For example, claim language reciting "at least one of A and B" means A, B, or A and B.

What is claimed is:

1. A system comprising:
a plurality of computing components coupled to one or more cold plates, wherein at least one of the plurality of computing components comprises a processor;
one or more phase change elements coupled to or embedded in the one or more cold plates and configured to collect a first portion of heat from a first portion of the plurality of computing components and transfer the first portion of the heat away from the first portion of the plurality of computing components via a first working fluid in the one or more phase change elements;
the one or more cold plates, wherein the one or more cold plates comprise one or more fluid channels, wherein each of the one or more fluid channels is configured to circulate a second working fluid from a respective fluid ingress point to a respective fluid egress point, and wherein each of the one or more fluid channels run adjacent to two or more sides of the plurality of computing components and the one or more phase change elements, and wherein the one or more fluid channels do not overlap in a first plane of the one or more cold plates with the plurality of computing components and the one or more phase change elements, the first plane being substantially perpendicular to a second plane defined by a thickness of the one or more cold plates;
a chassis housing the one or more cold plates, the plurality of computing components, and the one or more phase change elements.

2. The system of claim 1, wherein the two more sides is three sides.

3. The system of claim 1, wherein the one or more phase change elements have a curved shape, and wherein a first end of the one or more phase change elements is adjacent to at least a first one of the plurality of computing elements and a second end of the one or more phase change elements is adjacent to at least a second one of the plurality of computing elements.

4. The system of claim 1, wherein the one or more phase change elements have at least an L-shaped configuration.

5. The system of claim 4, wherein a first end of the at least the L-shaped configuration is adjacent to at least a first one of the plurality of computing elements and a second end of or the at least the L-shaped configuration is adjacent to at least a second one of the plurality of computing elements.

6. The system of claim 1, wherein the one or more phase change elements comprise at least one of a heat pipe and a vapor chamber.

7. The system of claim 1, further comprising one or more heat sinks coupled to at least one of the one or more fluid channels and the one or more phase change elements.

8. The system of claim 1, wherein the plurality of computing components further comprises at least one of a controller, a circuit board, a memory, a field-programmable gate array, an application-specific integrated circuit, a storage device, a system-on-chip, a digital signal processor, and a graphics processing unit.

9. The system of claim 1, wherein the system is coupled to an autonomous vehicle and configured to perform one or more operations of the autonomous vehicle.

10. A method comprising:
collecting, via a first working fluid in one or more phase change elements coupled to or embedded in one or more cold plates on a computer system, a first portion heat from a first portion of a plurality of computing components coupled to the one or more cold plates, wherein at least one of the plurality of computing components comprises a processor, wherein the one or more cold plates comprise one or more fluid channels, wherein each of the one or more fluid channels is configured to circulate a second working fluid from a respective fluid ingress point to a respective fluid egress point, and wherein each of the one or more fluid channels run adjacent to two or more sides of the plurality of computing components and the one or more phase change elements, and wherein the one or more fluid channels do not overlap in a first plane of the one or more cold plates with the plurality of computing components and the one or more phase change elements, the first plane being substantially perpendicular to a second plane defined by a thickness of the one or more cold plates;
transferring, via the first working fluid in the one or more phase change elements, the first portion of the heat away from the first portion of the plurality of computing components;
collecting, via the second working fluid of the one or more fluid channels, a second portion of the heat from a second portion of the plurality of computing components; and
transfer, via the second working fluid of the one or more fluid channels, the second portion of the heat away from the second portion of the plurality of computing components.

11. The method of claim 10, wherein the computer system comprises a chassis housing the one or more cold plates, the plurality of computing components, and the one or more phase change elements.

12. The method of claim 10, wherein the two more sides is three sides.

13. The method of claim 10, wherein the one or more phase change elements have a curved shape, and wherein a first end of the one or more phase change elements is adjacent to at least a first one of the plurality of computing elements and a second end of the one or more phase change elements is adjacent to at least a second one of the plurality of computing elements.

14. The method of claim 10, wherein the one or more phase change elements have at least an L-shaped configuration.

15. The method of claim 14, wherein a first end of the at least the L-shaped configuration is adjacent to at least a first one of the plurality of computing elements and a second end of the at least the L-shaped configuration is adjacent to at least a second one of the plurality of computing elements.

16. The method of claim 10, wherein the one or more phase change elements comprise at least one of a heat pipe and a vapor chamber.

17. The method of claim 10, further comprising dissipating, via one or more heat sinks coupled to at least one of the one or more fluid channels and the one or more phase change elements, a third portion of the heat from one or more of the plurality of computing components.

18. The method of claim 10, wherein the plurality of computing components further comprises at least one of a controller, a circuit board, a memory, a field-programmable gate array, an application-specific integrated circuit, a storage device, a system-on-chip, a digital signal processor, and a graphics processing unit.

19. The method of claim 10, wherein the computing system is coupled to an autonomous vehicle and configured to perform one or more operations of the autonomous vehicle.

20. The method of claim 10, wherein the one or more phase change elements are external to the one or more fluid channels.

* * * * *